United States Patent
Naaman et al.

(10) Patent No.: US 11,799,432 B2
(45) Date of Patent: Oct. 24, 2023

(54) MULTIPLEXED READOUT SYSTEM

(71) Applicant: Google LLC, Mountain View, CA (US)

(72) Inventors: Ofer Naaman, Mountain View, CA (US); Evan Jeffrey, Mountain View, CA (US); Theodore Charles White, Mountain View, CA (US)

(73) Assignee: Google LLC, Mountain View, CA (US)

( * ) Notice: Subject to any disclaimer, the term of this patent is extended or adjusted under 35 U.S.C. 154(b) by 0 days.

(21) Appl. No.: 17/763,331

(22) PCT Filed: Sep. 23, 2020

(86) PCT No.: PCT/US2020/052223
§ 371 (c)(1),
(2) Date: Mar. 24, 2022

(87) PCT Pub. No.: WO2021/061776
PCT Pub. Date: Apr. 1, 2021

(65) Prior Publication Data
US 2022/0337207 A1    Oct. 20, 2022

Related U.S. Application Data

(60) Provisional application No. 62/905,026, filed on Sep. 24, 2019.

(51) Int. Cl.
*H03F 19/00* (2006.01)
*H01L 39/22* (2006.01)

(52) U.S. Cl.
CPC ....... *H03F 19/00* (2013.01); *H03F 2200/165* (2013.01); *H03F 2200/171* (2013.01)

(58) Field of Classification Search
CPC ............... H03F 19/00; H03F 2200/165; H03F 2200/171; G06N 10/00
(Continued)

(56) References Cited

U.S. PATENT DOCUMENTS 8,117,000 B2    2/2012  Divincenzo et al.
9,438,246 B1 *  9/2016  Naaman ................ G06N 10/00
(Continued)

FOREIGN PATENT DOCUMENTS

WO    WO 2018/052427    3/2018
WO    WO 2019/117949    6/2019

OTHER PUBLICATIONS

Bergeal et al., "Phase preserving amplification near the quantum limit with a Josephson Ring Modulator," Nature, May 2010, 465:64-68.
(Continued)

*Primary Examiner* — Hieu P Nguyen
(74) *Attorney, Agent, or Firm* — Fish & Richardson P.C.

(57) ABSTRACT

A circuit is presented which includes a first amplifier having an input, a transmission line having first and second ends. The first end of the transmission line is coupled to an input of the first amplifier and a plurality of channels. Each channel includes a plurality of resonators arranged to read out a plurality of qubits, respectively and a readout line arranged to receive read out signals from the plurality of resonators. The readout line of each channel is coupled to the transmission line and each channel is configured to output a respective signal in a respective frequency band which is different from frequency bands of other channels in the plurality of channels.

13 Claims, 8 Drawing Sheets

(58) Field of Classification Search
USPC .................................................. 330/45, 286
See application file for complete search history.

(56) References Cited

U.S. PATENT DOCUMENTS

| | | | | |
|---|---|---|---|---|
| 9,870,536 | B1* | 1/2018 | Abdo | H10N 60/12 |
| 11,417,822 | B2* | 8/2022 | Bronn | H10N 60/12 |
| 2018/0091244 | A1 | 3/2018 | Baleegh | |
| 2020/0320423 | A1* | 10/2020 | Kelly | H10N 60/80 |

OTHER PUBLICATIONS

Coale, "A Traveling-Wave Directional Filter," IRE Transaction on Microwave Theory and Techniques, Oct. 1956, pp. 256-260.
Galbraith et al., "Cochlea-Based RF Channelizing Filters," IEEE Transactions on Circuits and Systems—I: Regular Papers, May 2008, 55(4):969-979.
International Preliminary Report on Patentability in International Appln. No. PCT/US2020/052223, dated Mar. 15, 2022, 12 pages.
International Search Report and Written Opinion in International Appln. No. PCT/US2020/052223, dated Feb. 8, 2021, 15 pages.
Lecocq et al., "Nonreciprocal microwave signal processing with a Field-Programmable Josephson Amplifier," Physical Review Applied, Feb. 2017, 7(2):024028.
Macklin et al., "A near-quantum-limited Josephson traveling-wave parametric amplifier," ScienceExpress, Sep. 2015, 8 pages.
Office Action in Australian Appln. No. 2020354489, dated Feb. 24, 2023, 3 pages.

* cited by examiner

MULTIPLEXED READOUT SYSTEM

CROSS-REFERENCE TO RELATED APPLICATIONS

This application is a National Stage Application under 35 U.S.C. §371 and claims the benefit of International Application No. PCT/US2020/052223, filed on Sep. 23, 2020, which claims priority to U.S. patent application Ser. No. 62/905,026, filed on Sep. 24, 2019. The disclosure of the prior applications are considered part of and are incorporated by reference in the disclosure of this application.

TECHNICAL FIELD

This present subject matter relates to readout systems for qubits.

BACKGROUND

Large-scale quantum computers have the potential to provide fast solutions to certain classes of difficult problems. Multiple challenges in the design and implementation of quantum architecture to control, program and maintain quantum hardware impede the realization of large-scale quantum computing.

SUMMARY

The present disclosure describes technologies for a multiplexed readout system for qubits.

In general, one innovative aspect of the subject matter of the present disclosure may be embodied in a circuit that includes a first amplifier having an input, a transmission line having first and second ends, wherein the first end of the transmission line is coupled to an input of the first amplifier, and a plurality of channels, each channel including a plurality of resonators arranged to read out a plurality of qubits, respectively, and a readout line arranged to receive read out signals from the plurality of resonators, wherein the readout line of each channel is coupled to the transmission line and wherein each channel is configured to output a respective signal in a respective frequency band which is different from frequency bands of other channels in the plurality of channels.

The foregoing and other implementations can each optionally include one or more of the following features, alone or in combination.

In some implementations, the transmission line is a first transmission line and the readout line comprised by each channel is a second transmission line, and each of the plurality of channels further comprises a second amplifier connected to the second transmission line configured to amplify the readout signals from the plurality of readout resonators before the readout signals from the plurality of readout resonators couple to the first transmission line.

In some implementations, the second amplifier is a Josephson junction parametric amplifier.

In some implementations, the Josephson junction parametric amplifier is any one of a JPC amplifier, a non-degenerate parametric amplifier, or a travelling wave amplifier.

In some implementations, each of the plurality of channels further comprises a circulator disposed between an output of the second transmission line and the Josephson junction parametric amplifier, arranged to receive and direct the readout signals to the second transmission line towards the plurality of resonators and to direct the readout signals reflected from the plurality of resonators to the Josephson junction parametric amplifier.

In some implementations, each second amplifier is configured to shift the frequencies of the readout signals to a different corresponding frequency band.

In some implementations, the first amplifier has a first frequency bandwidth and each of the plurality of channels has a different corresponding second frequency bandwidth, and each second frequency bandwidth is smaller than the first frequency bandwidth, does not overlap another second frequency bandwidth, and spans a frequency range within the first frequency bandwidth.

In some implementations, each of the plurality of channels further comprises a directional multiplexer configured to couple the readout signals from the readout line or the second transmission line to the first transmission line towards the first amplifier.

In some implementations, the directional multiplexer is arranged such that the readout signals travels uni-directionally towards the first amplifier in the first transmission line.

In some implementations, the directional multiplexer comprises at least one ring resonator, and the directional multiplexer further comprises a first port arranged to receive the signals from the plurality of readout resonators via the second transmission line, a second port connected to a termination resistor, a third port coupled to the first transmission line and a fourth port coupled to the first transmission line.

In some implementations, the directional multiplexer is arranged such that in response to the readout signals received at the first port and in resonance with the at least one ring resonator, the readout signals are directed to the fourth port and subsequently into the first transmission towards the first amplifier, in response to the readout signals received at the first port and out of resonance with the at least one ring resonator, the readout signals are directed to the second port and terminated at the termination resistor, in response to signals received at the third port from the first transmission line and out of resonance with the at least one ring resonator, the received signals are directed, via the fourth port, into the first transmission line, towards the first amplifier, in response to signals received at the third port from the first transmission line in resonance with the at least one ring resonator, the received signals are directed to the second port and terminated at the termination resistor.

In some implementations, the directional multiplexer comprises a first directional coupler, a second directional coupler, a first quarter wave connector and a second quarter wave connector, wherein the first directional coupler comprises a first port, a second port, a third port and a fourth port, wherein the second directional coupler comprises a first port, a second port, a third port and a fourth port, wherein the first port of the directional multiplexer comprises the first port of the second directional coupler, the second port of the directional multiplexer comprises the second port of the second directional coupler, the third port of the directional multiplexer comprises the second port of the first directional coupler and the fourth port of the directional multiplexer comprises the first port of the first directional coupler, wherein the fourth port of the first directional coupler is connected to the fourth port of the second directional coupler via the first quarter wave connector, and wherein the third port of the first directional coupler is connected to the third port of the second directional coupler via the second quarter wave connector.

In some implementations, the directional multiplexer comprises a first directional coupler, a second directional coupler, a third directional coupler, a first quarter wave connector, a second quarter wave connector, a third quarter wave connector and a fourth quarter wave connector, wherein the first directional coupler comprises a first port, a second port, a third port and a fourth port, wherein the second directional coupler comprises a first port, a second port, a third port and a fourth port, wherein the third directional coupler comprises a first port, a second port, a third port and a fourth port, wherein the first port of the directional multiplexer comprises the first port of the third directional coupler, the second port of the directional multiplexer comprises the second port of the third directional coupler, the third port of the directional multiplexer comprises the fourth port of the first directional coupler and the fourth port of the directional multiplexer comprises the third port of the first directional coupler, wherein the first port of the first directional coupler is connected to the first port of the second directional coupler via the first quarter wave connector, wherein the second port of the first directional coupler is connected to the second port of the second directional coupler via the second quarter wave connector, wherein the third port of the second directional coupler is connected to the third port of the third directional coupler via the third quarter wave connector, and wherein the fourth port of the second directional coupler is connected to the fourth port of the third directional coupler via the fourth quarter wave connector.

In some implementations, the first amplifier is a HEMT (High Electron Mobility Transistor) amplifier or a silicon germanium amplifier.

In some implementations, the first transmission line is impedance-matched at 50 Ohm.

The details of one or more embodiments are set forth in the accompanying drawings and the description below. Other features and advantages will be apparent from the description and drawings, and from the claims.

BRIEF DESCRIPTION OF THE DRAWINGS

FIG. 4b illustrates a simulation result of the directional band pass filter assembly described in FIG. 4a.

FIG. 5b is a schematic that illustrates the directional multiplexer assembly of FIG. 5a.

DETAILED DESCRIPTION

Figure 1:
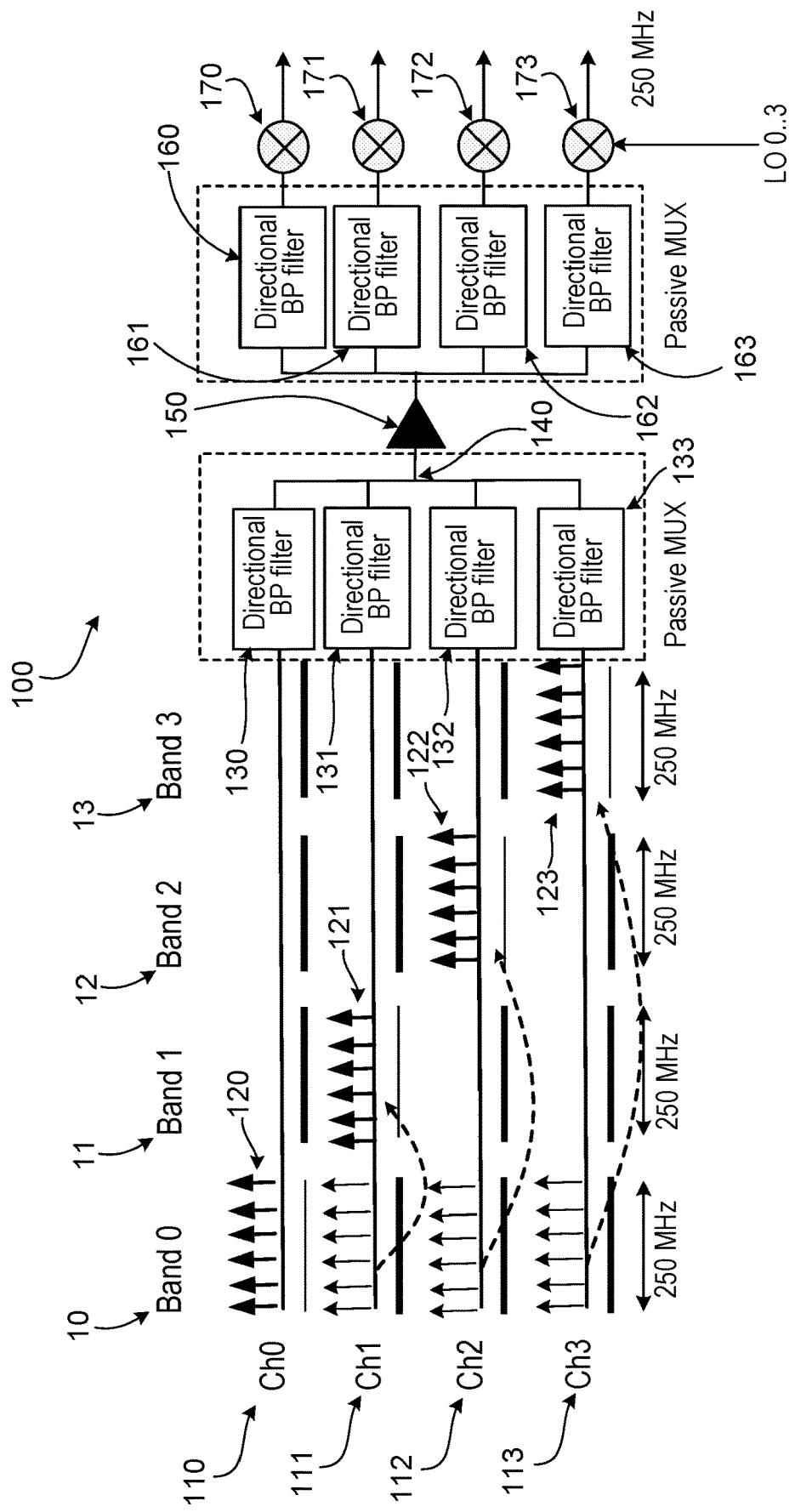
FIG. 1 is a schematic that illustrates an exemplary multiplexed qubit readout system.

Quantum computing entails coherently processing quantum information stored in the quantum bits (qubits) of a quantum computer. Superconducting quantum computing is a promising implementation of solid-state quantum computing technology in which quantum information processing systems are formed, in part, from superconducting materials.

To operate quantum information processing systems that employ solid-state quantum computing technology, such as superconducting qubits, the systems are maintained at extremely low temperatures, e.g., in the 10s of mK. The extreme cooling of the systems keeps superconducting materials below their critical temperature and helps avoid unwanted state transitions. To maintain such low temperatures, the quantum information processing systems may be operated within a cryostat, such as a dilution refrigerator.

In some implementations, control signals are generated in higher-temperature environments, and are transmitted to the quantum information processing system using shielded impedance-controlled GHz capable transmission lines, such as coaxial cables. The cryostat may step down from room-temperature (e.g., about 300 K) to the operating temperature of the qubits in one or more intermediate cooling stages. For instance, the cryostat may employ a stage maintained at a temperature range that is colder than room temperature stage by one or two orders of magnitude, e.g., about 30-40 K or about 3-4 K, and warmer than the operating temperature for the qubits (e.g., about 10 mK or less).

Even at the extremely low qubit operating temperatures, qubits may still suffer from decoherence and gate errors. As such, large-scale quantum error correction algorithms can be deployed to compensate for the gate errors and qubit decoherence. An error-corrected quantum processor leverages redundancy to synthesize protected logical qubits from ensembles of error-prone qubits.

Current superconducting quantum systems therefore may require in the future a large number of qubits to implement error correction algorithms. As the number of qubits increases, the thermal dissipation arising from peripherals, such as amplifiers on the readout system, also increases, and this may raise an issue in view of a limited cooling capability of a cryostat. In an exemplary readout system, readout resonators reading out signals from a plurality of qubits are coupled to a single readout channel and pre-amplified, for example, with a parametric amplifier. The pre-amplified signals on the single readout channel are, in turn, amplified by a chain of microwave amplifiers including a HEMT (High Electron Mobility Transistor) amplifier disposed within the cryostat and one or more amplifiers at room temperature. The resonance frequencies of the readout resonators of the qubits may be arranged to be distributed within the bandwidth of the readout channel and do not overlap with each other.

In designing a readout system for a larger number of qubits, the conditions to consider include the saturation intensity of the parametric amplifier, which limits the number of qubits in each readout channel, and the bandwidth of each readout channel, set by the bandwidth of the parametric amplifier and the bandwidth of a Purcell filter within each readout channel.

Since the power dissipation of the HEMT amplifier can be an appreciable fraction of the available cooling power of 3K stage of the cryostat, using multiple readout channels along with respective HEMT amplifiers may not be a viable option in designing a readout system for a larger number of qubits because this limits the number of separate readout lines that can be operated at the same time. However, more qubits can be read out per one HEMT amplifier considering in some of the exemplary schemes currently used, a majority of the bandwidth and the saturation power of the HEMT amplifier remains unused. For example, a typical bandwidth of the HEMT amplifier is several GHz whereas a typical bandwidth of each channel may be limited to be less than a GHz.

The present disclosure presents a directional multiplexer with a low insertion loss to combine signals from a plurality of readout channels, each readout channel including a plurality of qubits, readout resonators and a pre-amplifier, such that the plurality of readout channels can be passively frequency-multiplexed to cover a substantial part or the full bandwidth range of one HEMT amplifier.

The plurality of readout channels spanning across the full bandwidth range of the HEMT amplifier are arranged to each occupy a non-overlapping dedicated frequency band. This is achieved by either operating the pre-amplifiers in a frequency conversion mode and/or configuring the resonance frequencies of the qubit readout resonators in each channel as such.

FIG. 1 is a schematic that illustrates an exemplary multiplexed qubit readout system. A multiplexed qubit readout system 100 includes a plurality of channels 110, 111, 112, 113, also labelled as in the FIG. 1 as Ch0, Ch1, Ch2, Ch3. Each channel 110, 111, 112, 113 includes a plurality of qubits, 120, 121, 122, 123. The upward arrows in FIG. 1 represent the frequencies of the readout signal from each of the plurality of qubits 120, 121, 122, 123. In some implementations, the number of qubits 120, 121, 122, 123 in each channel is the same for all channels. The number of qubits which can be included per channel will be discussed in more detail later.

The multiplexed qubit readout system 100 further includes a plurality of directional multiplexers 130, 131, 132, 133. The plurality of directional multiplexers 130, 131, 132, 133 are arranged to couple signals from the plurality of qubits 120, 121, 122, 123 to a bus transmission line 140 such that the signals from the plurality of qubits 120, 121, 122, 123 are combined in the bus transmission line 140 and subsequently transmitted to a first amplifier 150. The first amplifier 150 may comprise a semiconductor low noise amplifier which is capable of operating at cryogenic temperature. The examples of the first amplifier 150 include the HEMT (High Electron Mobility Transistor) amplifier and a Silicon Germanium cryogenic low noise amplifier.

In some implementations, the plurality of channels 110, 111, 112, 113 may have a predetermined bandwidth. In some implementations, the bandwidths of the plurality of channels 110, 111, 112, 113 may be the same or different. In some implementations, the frequency bands of the plurality of channels may occupy dedicated frequency bands 10, 11, 12, 13 which do not overlap with one another. For example, in FIG. 1, the bandwidth of frequency bands 10, 11, 12, 13, also labelled as Band 0, Band 1, Band 2, Band 3 in FIG. 1 is 250 MHz. The frequency bands 10, 11, 12, 13, Band 0, Band 1, Band 2, Band 3 may be disposed adjacent to each other in frequency but do not overlap with each other.

In some implementations, the basic resonance frequencies of the qubits 120, 121, 122, 123 may be about 1 GHz away from the resonance frequencies of the readout resonator coupled to the qubit 120, 121, 122, 123 and only the resonance frequencies of the readout resonators may be within the frequency bands of the channels 10, 11, 12, 13. The basic resonance frequencies of the qubits 120, 121, 122, 123 may be arranged to lie outside the bandwidth of the respective channels 10, 11, 12, 13 to avoid decoherence.

In some implementations, the resonance frequencies of the readout resonators coupled respectively to the plurality of qubits 120, 121, 122, 123 included in each of the channels 110, 111, 112, 113 may be distributed over the bandwidth of the channel 110, 111, 112, 113. In other words, the resonance frequencies of the readout resonators coupled respectively to the plurality of qubits 120, 121, 122, 123 would be separated from one another with intervals larger than respective linewidths of the plurality of qubits 120, 121, 122, 123, or the linewidths of the readout resonators, for passive frequency multiplexing of the plurality of qubits 120, 121, 122, 123.

In some implementations, the resonance frequencies of the readout resonators coupled respectively to the plurality of qubits, 120, 121, 122, 123 may be spaced within the bandwidth of each channel 110, 111, 112, 113. For example, if the channels 110, 111, 112, 113 include 9 qubits each, and the bandwidth of the channels 110, 111, 112, 113 is 250 MHz, the qubit resonance frequencies of each channel may be spaced apart from each other by 25 MHz. In the example of FIG. 1, the channels 110, 111, 112, 113 include 6 qubits each. If the bandwidth of the channels 110, 111, 112, 113 is 250 MHz, the qubit resonance frequencies of each channel may be spaced apart from each other by 50 MHz. The frequency bands of the plurality of channels 110, 111, 112, 113 may be mutually non-overlapping in frequency. In other words, the frequency bands 10, 11, 12, 13 occupied by the output of each channel 110, 111, 112, 113 may not overlap with the frequency band occupied by the output of another channel 110, 111, 112, 113. Therefore, the plurality of channels 110, 111, 112, 113 are frequency-multiplexed. For example, in the example of FIG. 1, the center frequencies of the frequency bands of the plurality of channels 110, 111, 112, 113, with 250 MHz bandwidth, are spaced apart by at least 250 MHz.

In some implementations, the resonance frequencies of the readout resonators coupled respectively to the plurality of qubits, 120, 121, 122, 123 may be spaced apart from each other with non-equal or irregular intervals. For example, some of the qubits 120, 121, 122, 123 which are to be coupled with each other may be spaced closer to each other in frequency than others.

The outputs of the plurality of channels, 110, 111, 112, 113, are passively frequency-multiplexed and transmitted to the first amplifier 150.

In some implementations, the frequency bands of the outputs of the channels 110, 111, 112, 113 are frequency-multiplexed, because the resonance frequencies of the readout resonators coupled respectively to the qubits 120, 121, 122, 123 of one of the channels 110, 111, 112, 113 are configured to not overlap with the resonance frequencies of the qubits 120, 121, 122, 123 of another channel 110, 111, 112, 113. In other words, the resonance frequencies of the readout resonators coupled respectively to the qubits 120, 121, 122, 123 of one of the channels 110, 111, 112, 113 are configured to occupy the respective frequency bands 10, 11, 12, 13, which are non-overlapping in frequency.

In some implementations, the plurality of channels 110, 111, 112, 113 may additionally include a preamplifier which acts as a frequency converter, such as a parametric amplifier, which shifts the frequencies of the signals from the qubits 120, 121, 122, 123 in the channels 110, 111, 112, 113 such that the frequency bands of the outputs of the channels 110, 111, 112, 113 do not overlap in frequency, such that the output signals of the plurality of channels 110, 111, 112, 113 are frequency-multiplexed. For example, in the example of FIG. 1, the resonance frequencies of the readout resonators coupled respectively to the qubits 120, 121, 122, 123 of all of the channels 110, 111, 112, 113 may be initially all within Band 0, 10, which is one of the available frequency bands within the bandwidth of the first amplifier 150. Before the signals from the plurality of qubits 120, 121, 122, 123 are transmitted to the respective directional multiplexers, 130, 131, 132, 133, the frequency of the signals from the plurality of qubits 120, 121, 122, 123 are frequency converted, such that the channels Ch0, Ch1, Ch2, Ch3 occupy the frequency bands, Band 0, Band 1, Band 2, Band 3, respectively. These preamplifiers which act as frequency converters will be discussed in FIG. 2.

In some implementations, the plurality of channels 110, 111, 112, 113 may comprise the combination of the above two implementations. In other words, the frequency bands of the outputs of the channels 110, 111, 112, 113 are frequency-multiplexed because the resonance frequencies of the readout resonators coupled respectively to the qubits 120, 121, 122, 123 of one of the channels 110, 111, 112, 113 are configured to occupy the respective frequency bands 10, 11, 12, 13, which are non-overlapping in frequency and because a preamplifier included in each of the plurality of channels 110, 111, 112, 113 shifts the frequencies of the signals from the qubits 120, 121, 122, 123 in the channels 110, 111, 112, 113.

The frequency bands 10, 11, 12, 13 of the plurality of channels 110, 111, 112, 113 are included within the bandwidth of the first amplifier 150. For example, in the example of FIG. 1, since the bandwidth of the plurality of channels 110, 111, 112, 113 is 250 MHz, and there are four such channels 110, 111, 112, 113, the bandwidth of the first amplifier 150 is at least 1 GHz.

The directional multiplexers 130, 131, 132, 133, may be arranged to transmit the signals from the plurality of qubits 120, 121, 122, 123 of the channels 110, 111, 112, 113 to the bus transmission line 140. For example, in the example of FIG. 1, if the resonance frequencies of the readout resonators coupled respectively to the qubits 120, 121, 122, 123 are distributed over the full bandwidth of 250 MHz of each channel 110, 111, 112, 113, the bandwidth of the directional multiplexer should be at least 250 MHz such that the signals from all of the qubits 120, 121, 122, 123 within each channel 110, 111, 112, 113 are transmitted to the bus transmission line 140 via the directional multiplexer 130, 131, 132, 133.

The directional multiplexers 130, 131, 132, 133 are coupled to the bus transmission line 140 such that the signals outputted from the directional multiplexers 130, 131, 132, 133 are coupled into the bus transmission line. In some implementations, the directional multiplexers 130, 131, 132, 133 may be resonant devices which include one or more resonators, as will be described in more detail later.

The multiplexed qubit readout system 100 further includes a plurality of receiver directional de-multiplexers 160, 161, 162, 163 arranged to de-multiplex the amplified signals output from the HEMT amplifier 150. In other words, since the signals outputted from the channels 110, 111, 112, 113, which occupy different frequency bands 10, 11, 12, 13, are combined in the bus transmission line 140 before being amplified by the first amplifier 150, the amplified signal is split into the respective bands 10, 11, 12, 13 after being amplified and before being processed, such as being demodulated at a plurality of mixers 170, 171, 172, 173.

In some implementations, the receiver directional de-multiplexers 160, 161, 162, 163 may be designed to be identical to the directional multiplexers 130, 131, 132, 133.

Alternatively, in some implementations, the receiver directional de-multiplexers 160, 161, 162, 163 may be implemented with commercial-off-the-shelf components since the insertion-loss and power dissipation requirements on the de-multiplexing are far less stringent because de-multiplexing may be operated at room temperature and the HEMT amplifier 150 dominates the system noise figure.

In some implementations, the receiver directional de-multiplexers 160, 161, 162, 163 are not required if the full bandwidth of the HEMT amplifier 150 can be directly digitized.

The total number of qubits 120, 121, 122, 123 in each channel 110, 111, 112, 113 may be limited by parameters of the preamplifier which acts as a frequency converter, such as the saturation intensity of a Josephson junction parametric frequency converter, and also limited by the bandwidth of each readout channel, set by the bandwidth of the preamplifier and the bandwidth of readout resonators of the qubits 120, 121, 122, 123 within each readout channel. This will be discussed in more detail below.

The total number of channels may be determined by the bandwidths of the channels 110, 111, 112, 113 and the bandwidth of the first amplifier 150. For example, in the example of FIG. 1, each channel 110, 111, 112, 113 has a bandwidth of 250 MHz. If the bandwidth of the first amplifier is 4 GHz, as is available with commercially available HEMT amplifier, there can be maximum 16 channels.

Therefore, a larger number of qubits 120, 121, 122, 123 may be used per one HEMT amplifier by increasing the number of channels 110, 111, 112, 113 such that the majority of the bandwidth of the HEMT amplifier is used.

Figure 2:
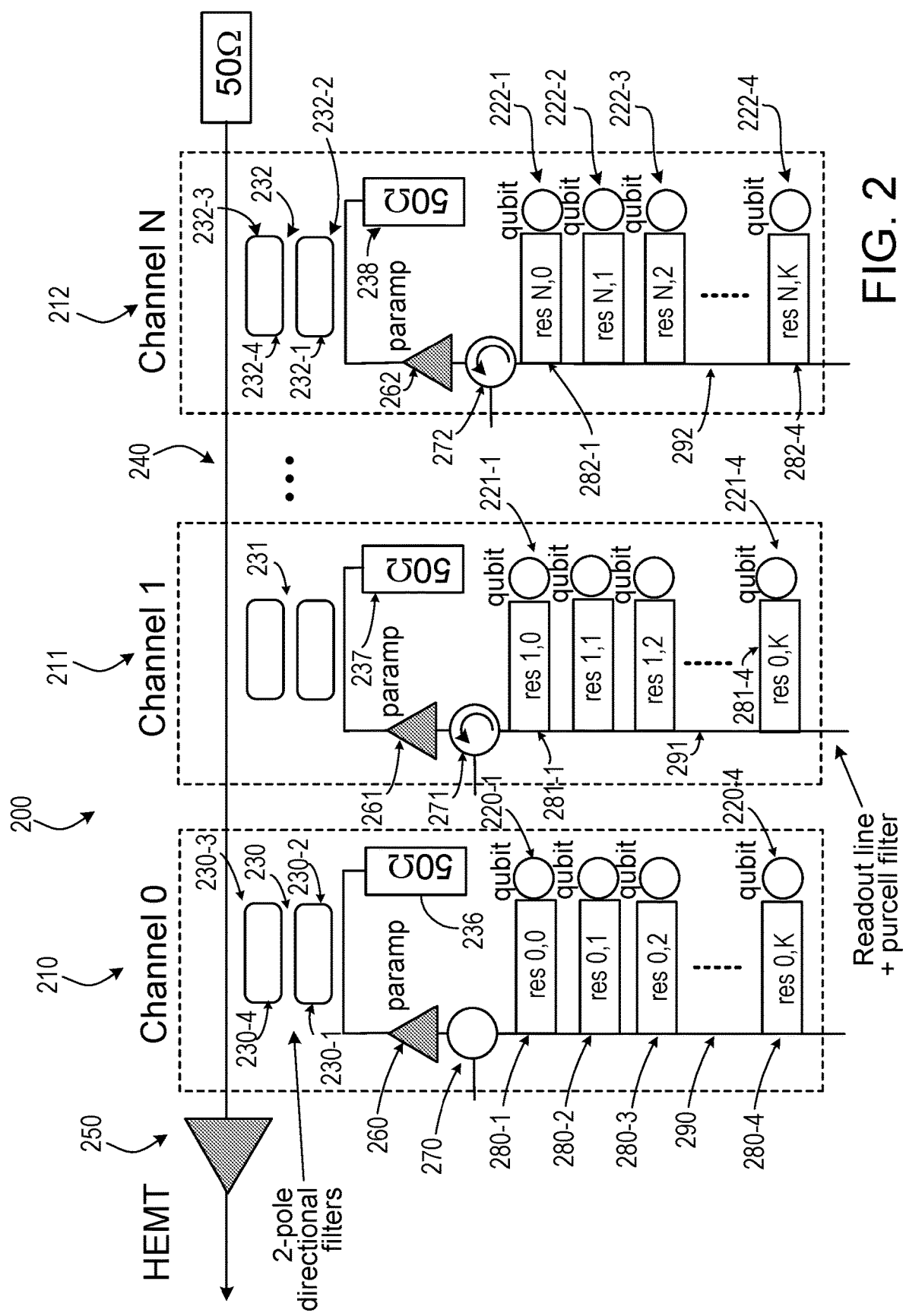
FIG. 2 is a schematic that illustrates an exemplary multiplexed qubit readout system.

FIG. 2 is a schematic that illustrates an exemplary multiplexed qubit readout system.

As discussed in FIG. 1 above, the qubit readout system 200 includes the plurality of channels 210, 211, 212, labelled as Channel 0, Channel 1, . . . , Channel N in FIG. 2 and includes the bus transmission line 240 connected to the input terminal of the first amplifier 250, labelled in FIG. 2 as HEMT (High Electron Mobility Transistor).

In some implementations, the first amplifier 250 comprises a HEMT amplifier. However, the type of the first amplifier 250 is not limited to the HEMT amplifier. The first amplifier 250 may comprise any semiconductor low noise amplifier which is capable of operating at cryogenic temperature such as a silicon germanium cryogenic low noise amplifier.

In some implementations, the bus transmission line 240 may be a 50 Ohm transmission line.

As discussed above, the number of channels 210, 211, 212, N+1, is determined by considering the bandwidth of each of the channels 210, 211, 212 and the bandwidth of the first amplifier 250. For example, if each channel 210, 211, 212 has a bandwidth of 250 MHz and the bandwidth of the first amplifier 250 is 4 GHz, the number of channels, N+1, may be up to 16.

The plurality of channels 210, 211, 212 are coupled to the bus transmission line 240 via a plurality of directional multiplexers 230, 231, 232 included in the respective plurality of channels 210, 211, 212.

Each channel 210, 211, 212 includes a plurality of readout resonators 280, 281, 282 for reading out signals from the respective plurality of qubits 220, 221, 222. Since the plurality of the readout resonators 280, 281, 282 are coupled to the plurality of qubits 220, 221, 222, the resonance frequencies of the respective plurality of readout resonators 280, 281, 282 change depending on the state of the plurality of qubits 220, 221, 222.

Each channel 210, 211, 212 includes a readout transmission line 290, 291, 292. The plurality of readout resonators 280, 281, 282 are coupled to the readout transmission line 290, 291, 292. The plurality of readout resonators 280, 281, 282 are coupled inductively or capacitively to the readout transmission line 290, 291, 292. In some implementations, the readout transmission line 290, 291, 292 may itself be configured as a Purcell filter.

In some implementations, in order to read out or detect the state of any one of the plurality of qubits, 220, 221, 222, a probing signal, a travelling wave, may be excited along the readout transmission line 290, 291, 292. The frequency of the probing signal may be at the resonance frequency or in the vicinity of the resonance frequency of one or more of the plurality of the readout resonator of one or more of the plurality of qubits.

In some implementations, the resonance frequencies of the readout resonators 280, 281, 282 may accordingly be distributed over the frequency band of Channel 0 210 since the readout resonators 280, 281, 282 are tuned to be coupled to the respective plurality of the qubits 220, 221, 222. The frequency of the probing signal may be at the resonance frequency or in the vicinity of the resonance frequency of the readout resonator 280, 281, 282 coupled to one or more of the plurality of qubits 220, 221, 222.

Depending on the internal quantum mechanical state of the qubit 220, 221, 222, the intensity or phase of the probing signal transmitted along the readout transmission line 290, 291, 292 may be altered because the reflectivity of the readout resonator 280, 281, 282 coupled to the qubit 220, 221, 222 changes depending on the state of the qubit 220, 221, 222. This allows for the state detection of the qubits 220, 221, 222.

In some implementations, the probing signal sent into the readout transmission line 290, 291, 292 may comprise a plurality of tones or frequencies such that readout is accomplished in parallel on all qubits 220, 221, 222 coupled to the readout transmission line 290, 291, 292 simultaneously.

In some implementations, the probing signal sent into the readout transmission line 290, 291, 292 may comprise one tone, or one frequency. In this case, by changing the frequency of the probing signal transmitted along the readout transmission line 290, 291, 292, the state of the plurality of qubits 220, 221, 222 can be read out individually one at a time.

In some implementations, the qubits 220, 221, 222 in the plurality of channels 210, 211, 212 may be disposed on a separate substrate from some of the other features included in the qubit readout system 200. For example, the qubits 220, 221, 222 of all channels 210, 211, 212 may be disposed on a first surface of a first substrate and readout resonators 280, 281, 282 of all channels 210, 211, 212 may be disposed on a first surface of a second substrate. The first substrate and the second substrate may be aligned such that the first surfaces of the first substrate and the second substrate face each other, and the readout resonators 280, 281, 282 on the second substrate are aligned with and in close proximity to respective ones of the corresponding qubits 220, 221, 222.

In some implementations, the resonance frequencies of a qubit 220, 221, 222 within each channel 210, 211, 212 may be different from another qubit 220, 221, 222 within the same channel 210, 211, 212. For example, in the example of FIG. 2, the resonance frequencies of the readout resonators 280-1, 280-2, 280-3, 280-4 coupled respectively to the qubits 220-1, 220-2, 220-3, 220-4 in Channel 0 210 may be distributed uniformly within the frequency band of Channel 0 210 such that none of the resonance frequencies of the readout resonators 280-1, 280-2, 280-3, 280-4 coupled respectively to the qubits 220-1, 220-2, 220-3, 220-4 overlaps with each other. The resonance frequencies of the qubits 220-1, 220-2, 220-3, 220-4 may be about 1 GHz away from the resonance frequencies of the readout resonators 280-1, 280-2, 280-3, 280-4 coupled respectively to them and may lie outside the bandwidth of Channel 0 210 to avoid decoherence.

Each channel 210, 211, 212 further includes a preamplifier 260, 261, 262.

Each channel 210, 211, 212 further includes at least one circulator 270, 271, 272.

In some implementations, the preamplifier 260, 261, 262 may comprise a parametric frequency converter.

Parametric frequency converters are nonlinear devices in which a reactance in the circuit is modulated by a pump tone of frequency fp to facilitate frequency conversion from a first band of frequencies $\Delta f$ centered around f1 to a second band of frequencies $\Delta f$ centered around f2, such that $f2=f1+fp$.

In some implementations, the preamplifier 260, 261, 262 may comprise a parametric amplifier.

In some implementations, the preamplifier 260, 261, 262 may comprise a Josephson junction frequency converter, in which the nonlinear medium of the Josephson junction parametric amplifier is provided by a Josephson junction.

Parametric amplifiers are nonlinear devices in which a reactance in the circuit is modulated by a pump tone of frequency fp to facilitate amplification and frequency conversion from a first band of frequencies $\Delta f$ centered around f1 to a second band of frequencies $\Delta f$ centered around f2, such that $fp=f1+f2$.

In some implementations, the preamplifier 260, 261, 262 may comprise a Josephson junction parametric amplifier, in which the nonlinear medium of the Josephson junction parametric amplifier is provided by a Josephson junction.

In some implementations, the preamplifier 260, 261, 262 may be arranged to amplify the intensity of the probing signal.

In the example of FIG. 2, it will be assumed that the preamplifier 260, 261, 262 comprises a Josephson junction parametric frequency converter unless otherwise noted. For frequency conversion, a pump tone is provided to the Josephson junction parametric frequency converter 260, 261, 262.

In some implementations, the pump tone is provided to the Josephson junction parametric frequency converter 260, 261, 262. The terminal through which the pump tone is provided to Josephson junction parametric frequency converter 260, 261, 262 is not shown in FIG. 2. The circulator 270, 271, 272 may be disposed between the Josephson junction parametric frequency converter 260, 261, 262 and the plurality of readout resonators 280, 281, 282 such that the pump tone or signal tone reflected from the preamplifier 260, 261, 262 is terminated without travelling back to the qubits 220, 221, 222.

The probing signals may be provided to the terminal of the circulators 270, 271, 272, shown in FIG. 2 to be a horizontal line, which is not directly connected to the Josephson junction parametric frequency converter 260, 261, 262 and not directly connected to the readout transmission line 290, 291, 292. The probing signals are sent into the readout transmission line 290, 291, 292 via the circulators 270, 271, 272. The probing signals reflected from the readout resonators, 280, 281, 282 are sent back to the circulators 270, 271, 272 subsequently to be directed to the Josephson junction parametric frequency converter 260, 261, 262. In the example of FIG. 2, the Josephson junction parametric frequency converter 260, 261, 262 is configured as a transmission type, in which the probing signals amplified by the Josephson junction parametric frequency converter 260, 261, 262 are mainly transmitted and not reflected back to the circulator 270, 271, 272. In case the Josephson junction parametric frequency converter 260, 261, 262 are configured as a reflection type, another circulator may be required per channel to redirect the amplified probing signal.

In some implementations, the preamplifier 260, 261, 262 may be arranged to up-convert the probing signal. For example, the preamplifier 260, 261, 262 may comprise a Josephson junction parametric frequency converter 260, 261, 262 configured to change the frequency of the probing signals to a higher frequency.

The various implementations of up-converting parametric frequency converters are well known in the field. For example, up-converting parametric frequency converters can be implemented using a JPC amplifier, a travelling wave amplifier, or a non-degenerate parametric amplifier, which naturally performs frequency conversion through the generation of an idler tone.

In some implementations, the intensity of the probing signal may be kept below a certain level such that the electric field from the probing signal within the readout resonators does not cause decoherence to the qubit 220, 221, 222.

In some implementations, the probing signal sent into the readout transmission line 290, 291, 292 may comprise multiple tones, or a plurality of frequencies such that the states of multiple qubits 220, 221, 222 can be read out simultaneously. The probing signal with multiple tones may be sent into the preamplifier 260 simultaneously. Therefore, the number of qubits 220, 221, 222 which can be probed simultaneously may be limited by the saturation intensity of preamplifier 260, 261, 262, for example, the Josephson junction parametric frequency converter.

For example, the intensity of the probing signal may be between −130 dBm to −120 dBm per frequency tone. The saturation power of the preamplifier 260, 261, 262 may be between −110 dBm and −90 dBm depending on the architecture of the preamplifier 260, 261, 262. Therefore, more than 10 qubits 220, 221, 222 may be included in a single channel 210, 211, 212. By improving the saturation power of the preamplifier 260, 261, 262, for example by using a travelling wave parametric amplifier (TWPA) configuration, a larger number of qubits 220, 221, 222 may be included per channel 210, 211, 212.

In relation to the bandwidth, the exemplary bandwidth allocated to each readout resonator may be from 20 to 50 MHz. The exemplary bandwidth of the preamplifier 260, 261, 262 may be around 500 MHz. Therefore, 10 or more qubits 220, 221, 222 may be included in a single channel 210, 211, 212. For a travelling wave parametric amplifier (TWPA), the exemplary bandwidth may be around 2 to 3 GHz such that a larger number of qubits 220, 221, 222. In this case, the number of qubits 220, 221, 222 which can be included within each channel 210, 211, 212 may be also limited by the saturation power of the travelling wave parametric amplifier (TWPA). Also, directional multiplexers which will be described below, may be designed such that it matches the required bandwidth.

Each channel 210, 211, 212 further includes a directional multiplexer 230, 231, 232.

In some implementations, the directional multiplexer 230, 231, 232 may be designed as a resonator structure such that the probing signal containing the information on the state of the plurality of qubits is coupled into the bus transmission line 240 and subsequently into the input port of the first amplifier 250 in a unidirectional fashion.

In some implementations, the directional multiplexer 230, 231, 232 may be configured as a plurality of 2-pole ring resonator directional filters such that the signals from the plurality of readout resonators 280, 281, 282 which are resonant with or within the passband of the directional multiplexer 230, 231, 232 are coupled uni-directionally into the bus transmission line 240 and in turn into the input port of the first amplifier 250.

In some implementations, the directional multiplexer 230, 231, 232 may be configured as a plurality of 2-pole ring resonator directional filters such that the signals from the plurality of readout resonators 280, 281, 282 within respective channels 210, 211, 212 which are out of resonance with or outside the passband of the directional multiplexer 230, 231, 232 are prevented from being coupled to the bus transmission line 240 by being terminated at a termination resistor 236, 237, 238.

In some implementations, the directional multiplexer 230, 231, 232 may include four ports, a first port 230-1, 231-1, 232-1, a second port 230-2, 231-2, 232-2, a third port, 230-3, 231-3, 232-3, and a fourth port, 230-4, 231-4, 232-4. The third port 230-3, 231-3, 232-3 and the fourth port 230-4, 231-4, 232-4 are coupled to the bus transmission line 240. The first amplifier 250 is assumed to be on the side of the fourth port 230-4, 231-4, 232-4 of the directional multiplexer 230, 231, 232.

In some implementations, the directional multiplexer 230, 231, 232 may be further configured as follows:

The output from the preamplifier 260, 261, 262, such as a Josephson parametric frequency converter, is coupled into the first port 230-1, 231-1, 232-1 of the directional multiplexer 230, 231, 232. If the output of the preamplifier 260, 261, 262 is resonant with or within the passband of the directional multiplexer 230, 231, 232, this signal exits the directional multiplexer 230, 231, 232 at the fourth port 230-4, 231-4, 232-4 into the bus transmission line 240 towards the first amplifier 250.

If the output of the parametric frequency converter 260, 261, 262 is out of resonance with or outside the passband of the directional multiplexer 230, 231, 232, after the output from the preamplifier 260, 261, 262 is coupled into the first port 230-1, 231-1, 232-1 of the directional multiplexer 230, 231, 232, this signal exits the directional multiplexer 230, 231, 232 at the second port 230-2, 231-2, 232-2 which is terminated with the termination resistor 236, 237, 238, and becomes dissipated at the termination resistor 236, 237, 238.

The signal entering the third port 230-3, 231-3, 232-3 of the directional multiplexer 230, 231, 232 from the bus transmission line 240 is coupled into the fourth port 230-4, 231-4, 232-4 if the signal is non-resonant with or outside the passband of the directional multiplexer 230, 231, 232.

The signal entering the third port 230-3, 231-3, 232-3 of the directional multiplexer 230, 231, 232 from the bus transmission line 240 is terminated at the termination resistor 236, 237, 238 at the second port 230-2, 231-2, 232-2 of the directional multiplexer 230, 231, 232 if the signal is resonant with or within the passband of the directional multiplexer 230, 231, 232.

In some implementations, when the preamplifier 260, 261, 262 is a Josephson junction parametric frequency converter, the frequency of the pump tone sent into the Josephson junction parametric frequency converter may be determined such that after frequency upconversion, the signals from the plurality of readout resonators 280, 281, 282 are resonant with or within the passband of the directional multiplexers 230, 231, 232 such that they are coupled to the bus transmission line 240.

In some implementations, the resonance frequencies of the readout resonators 281, 282, 283 of all of the qubits 220, 221, 222 in the plurality of channels 210, 211, 212 may be arranged to be different from each other such that the resonance frequencies of all of the qubits 220, 221, 222 do not overlap in frequency. In this case, the preamplifier 260 may be configured such that the intensity of the probing signal is amplified without changing the frequency of the probing signal. For example, the preamplifier 260 may be Josephson junction parametric amplifier and the frequency of the pump tone provided to the Josephson junction parametric amplifier may be configured such that the frequency of the probing signal is not changed. In this case, passive frequency multiplexing of the plurality of qubits 220, 221, 222 may be achieved by configuring the resonance frequencies of the readout resonators coupled respectively to the qubits 220, 221, 222 to be different from each other.

In some implementations, the resonance frequencies of the readout resonators coupled respectively to the qubits 220, 221, 222 in at least two of the plurality of channels 210, 211, 212 may be configured such that they occupy the same frequency bands. In other words, the frequency band occupied by the qubits 220, 221, 222 in one of the channels 210, 211, 212 may also be occupied by another channel 211, 212. In this case, the preamplifier 260, 261, 262 of the at least two channels 210, 211, 212 may be configured such that the frequency of the probing signal is changed by the preamplifier 260, 261, 262 such that the frequency band occupied by the at least two channels 210, 211, 212 are different in the bus transmission line 240.

For example, Channel 0 210 and Channel 1 211 may occupy the same frequency band from 5.00 GHz to 5.25 GHz, with a bandwidth 250 MHz and each include 6 qubits 220, 221 coupled respectively to 6 readout resonators 280, 281 which are spaced from each other in frequency by 50 MHz. In this case, the preamplifier 260, 261 may be Josephson junction parametric frequency converter and the frequency of the pump tones provided to the Josephson junction parametric amplifiers may be configured such that the frequency band of the output signal of Channel 0 210 is unchanged, namely from 5.00 GHz to 5.25 GHz, and such that the frequency band of the output signal of Channel 1 211 is up-converted to from 5.50 GHz to 5.75 GHz. The frequency of the pump tone in Channel 0 is 10 GHz, and the frequency of the pump tone in Channel 1 is 10.5 GHz. Alternatively, in case the preamplifier is a degenerate amplifier (either phase sensitive or not) followed by a unity-gain parametric frequency converter, for the frequency band of the output signal of Channel 1 211 to be up-converted to from 5.50 GHz to 5.75 GHz, the frequency of the converter pump tone in Channel 1 is 500 MHz.

The bandwidth of each channel 210, 211, 212 may be determined by the combination of the following parameters: the bandwidth of the preamplifier 260, 261, 262, the bandwidth of the directional multiplexer 210, 211, 212, and the bandwidth of a Purcell filter, not shown in FIG. 2, which may be placed between the readout resonators 280 and the readout transmission lines 290, 291, 292.

Figure 3:
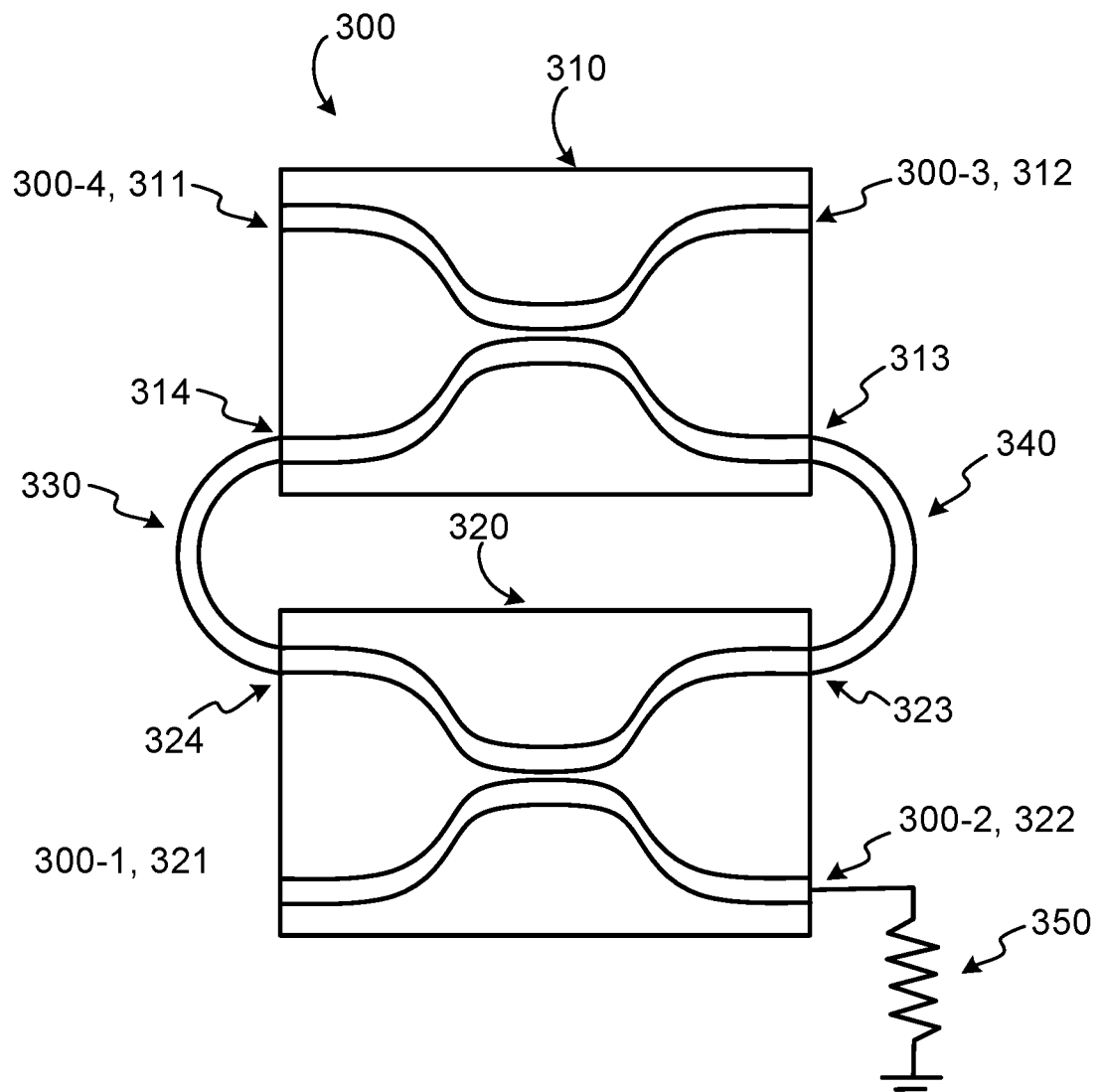
FIG. 3 is a schematic that illustrates an exemplary directional multiplexer.

FIG. 3 is a schematic that illustrates an exemplary directional multiplexer.

In some implementations, the directional multiplexer 300 may a first directional coupler 310, a second directional coupler 320, a first quarter-wave transmission line 330, and a second quarter-wave transmission line 340.

The first directional coupler 310 includes a first input port 311, a first transmitted port 312, a first isolated port 313, and a first coupled port 314.

The second directional coupler 320 includes a second input port 321, a second transmitted port 322, a second isolated port 323, and a second coupled port 324.

The first directional coupler 310 and the second directional coupler 320 may be a quarter-wave or quarter wavelength directional coupler such that a closed path with a circumference of one wavelength is formed with the first directional coupler 310, the second directional coupler 320, the first quarter-wave transmission line 330 and the second quarter-wave transmission line 340.

In some implementations, the first directional coupler 310 and the second directional coupler 320 may be made of stripline waveguides or co-planar waveguides.

The first quarter-wave transmission line 330 connects the first coupled port 314 and the second coupled port 324.

The second quarter-wave transmission line 340 connects the first isolated port 313 and the second isolated port 323.

The second transmitted port 322 is terminated with a termination resistor 350.

In some implementations, when the first directional coupler 310, the second directional coupler 320, the first quarter-wave transmission line 330, and the second quarter-wave transmission line 340 are connected to each other as above, the second input port 321 is a first port 300-1 of the directional multiplexer 300, the second transmitted port 322 is a second port 300-2 of the directional multiplexer 300, the first transmitted port 312 is a third port 300-3 of the directional multiplexer 300, and the first input port 311 is a fourth port 300-4 of the directional multiplexer 300.

In some implementations, the directional multiplexer 300 may be further arranged as follows: If the signal entering the first port 300-1 of the directional multiplexer 300 is resonant with or within the passband of the directional multiplexer 300, this signal exits the directional multiplexer 300 at the fourth port 300-4.

If the signal entering the first port 300-1 of the directional multiplexer 300 is out of resonance with or outside the passband of the directional multiplexer 300, this signal exits the directional multiplexer 300 at the second port 300-2 which is terminated with the termination resistor 350, and becomes dissipated at the termination resistor 350.

The signal entering the third port 300-3 of the directional multiplexer 300 is coupled into the fourth port 300-4 if the signal is non-resonant with or outside the passband of the directional multiplexer 300.

The signal entering the third port 300-3 of the directional multiplexer 300 is terminated at the termination resistor 350 at the second port 300-2 of the directional multiplexer 300 if the signal is resonant with or within the passband of the directional multiplexer 300.

The signal entering the fourth port 300-4 of the directional multiplexer 300 is coupled into the third port 300-3 if the signal is non-resonant with or outside the passband of the directional multiplexer 300. As will be discussed in more detail below, the signal entering the fourth port 300-4, in the configuration as shown in FIG. 2 and in further examples below, corresponds to the reflection from the first amplifier 150, 250. To dissipate this signal, the terminating resistor may be disposed at the third port 300-3 of one of the directional multiplexers 210, 211, 212. For example, in FIG. 2, a terminating resistor is connected to the third port 232-3 of the directional multiplexer 232 of the Channel N 212, to dissipate the reflection from the first amplifier 250.

The signal entering the fourth port 300-4 of the directional multiplexer 300 is coupled to the first port 300-1 of the directional multiplexer 300 if the signal is resonant with or within the passband of the directional multiplexer 300. The signal entering the fourth port 300-4 corresponds, in the configuration as shown in FIG. 2 and in further examples below, to the reflection from the first amplifier 150, 250. The isolators 270, 271, 272 protect the qubits 220, 221, 222 from this reflected signal, and additional isolators may be disposed in each channel 210, 211, 212 for further rejection of the reflected signal.

In the multiplexed qubit readout system described in FIG. 2, the third port 300-3 and the fourth port 300-4 may be coupled to the bus transmission line 240 described above in FIG. 2. The directional multiplexer 300 may be arranged such that the fourth port 300-4 faces the first amplifier 250. The output from the preamplifier 260, 261, 262 described in FIG. 2, the readout transmission line 290, 291, 292 is coupled into the first port 300-1 of the directional multiplexer 300.

The directional multiplexer 300 may serve as a channelizing filter which combines multiple signals from the plurality of channels 210, 211, 212 in the bus transmission line 240 towards the first amplifier 250.

The directional multiplexer 300 may be implemented in the form of superconducting coplanar-waveguides therefore suitable for integration with superconducting quantum computing systems.

In some implementations, when the superconducting coplanar-waveguides are constructed to have 50 Ohm impedance, the termination resistor 350 may be a 50 Ohm resistor.

The directional multiplexer 300 comprises a single resonator with a circumference of one wavelength at frequency in the middle of the passband or at resonance of the resonator. The resonator may be a loop for travelling waves. The circumference of the resonator comprises two quarter wavelengths of the first quarter-wave transmission line 330 and the second quarter-wave transmission line 340 and two quarter wavelengths of the coupling lengths of the first directional coupler 310 and the second directional coupler 320.

The design of directional multiplexer 300 described above and shown in FIG. 3 is from the field of microwave engineering. The implementation of directional multiplexer 130, 131, 132, 133, 230, 231, 232 is not limited to the configuration described in FIG. 3. The directional multiplexer can be designed to include any number of resonators which are travelling wave loops whose circumference is a multiple of wavelengths at frequency in the middle of the passband or at resonance of the resonators. Coupling between the loops may be obtained by the use of directional couplers with quarter wavelength coupling region. The directional filter thus obtained with n-resonators has four ports. If such directional filter is excited at a port of the first resonator, travelling wave is excited in all of the resonators in one direction, either clockwise or counterclockwise, and the n-th resonator excites a unidirectional signal at another port of the n-th resonator. FIG. 5b below will show a design of directional multiplexer including two resonators for a 2-pole response.

The bandwidth of the directional multiplexer may be determined by the coupling strength of the directional couplers. Multipole response can be designed to adjust the bandwidth of the directional multiplexer.

The examples of directional multiplexers 130, 131, 132, 133, 230, 231, 232 may further include so-called cochlear filters or any variety of microwave multiplexers.

Figure 4A:
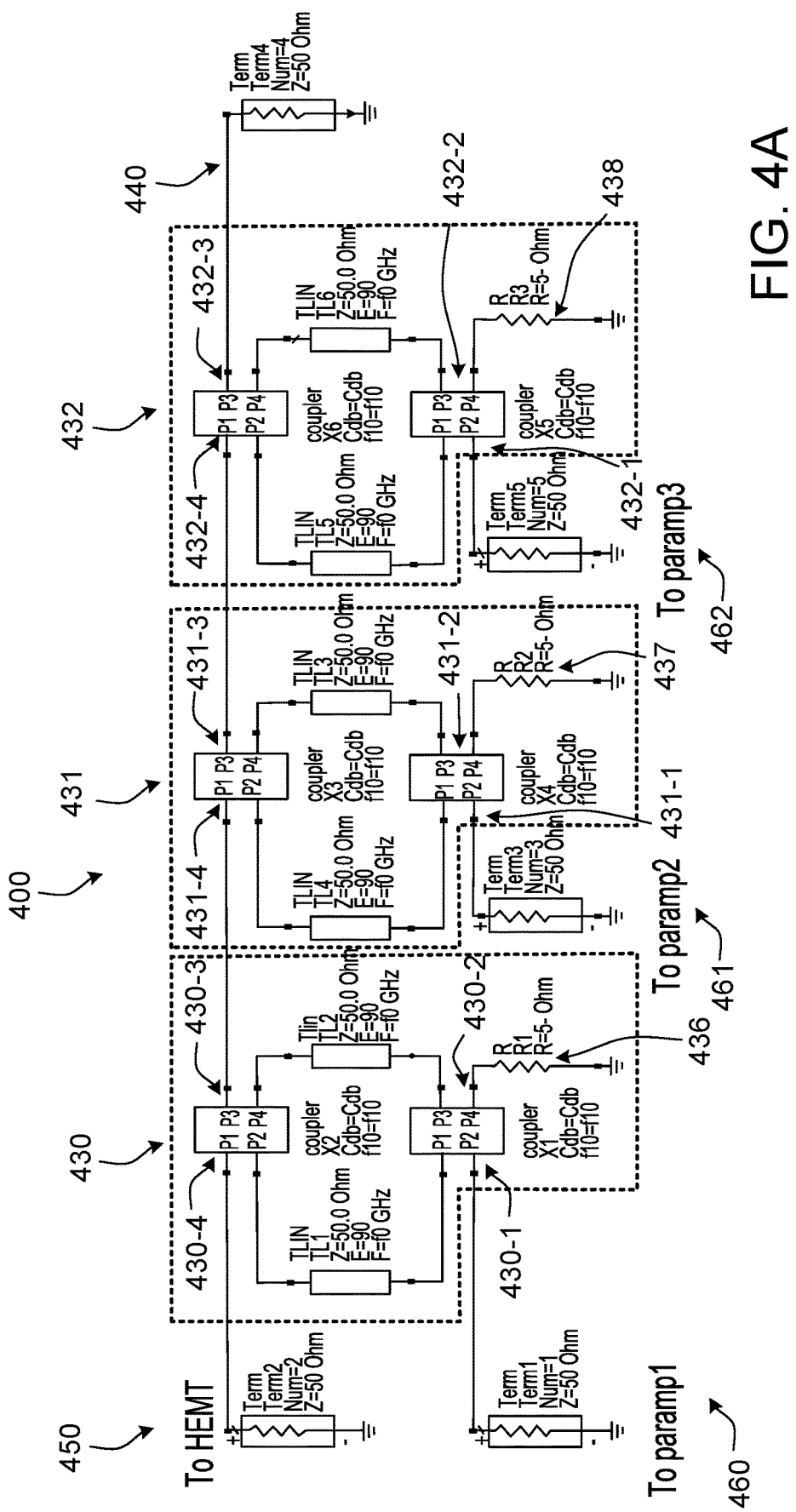
FIG. 4a is a schematic that illustrates an exemplary multiplexed qubit readout system.

FIG. 4a is a schematic that illustrates an exemplary multiplexed qubit readout system.

In particular, FIG. 4a shows part of the multiplexed qubit readout system 400 including the bus transmission line 440, the first amplifier 450, and a directional multiplexer assembly including a first directional multiplexer 430, a second directional multiplexer 431, and a third directional multiplexer 432.

Figure 4B:
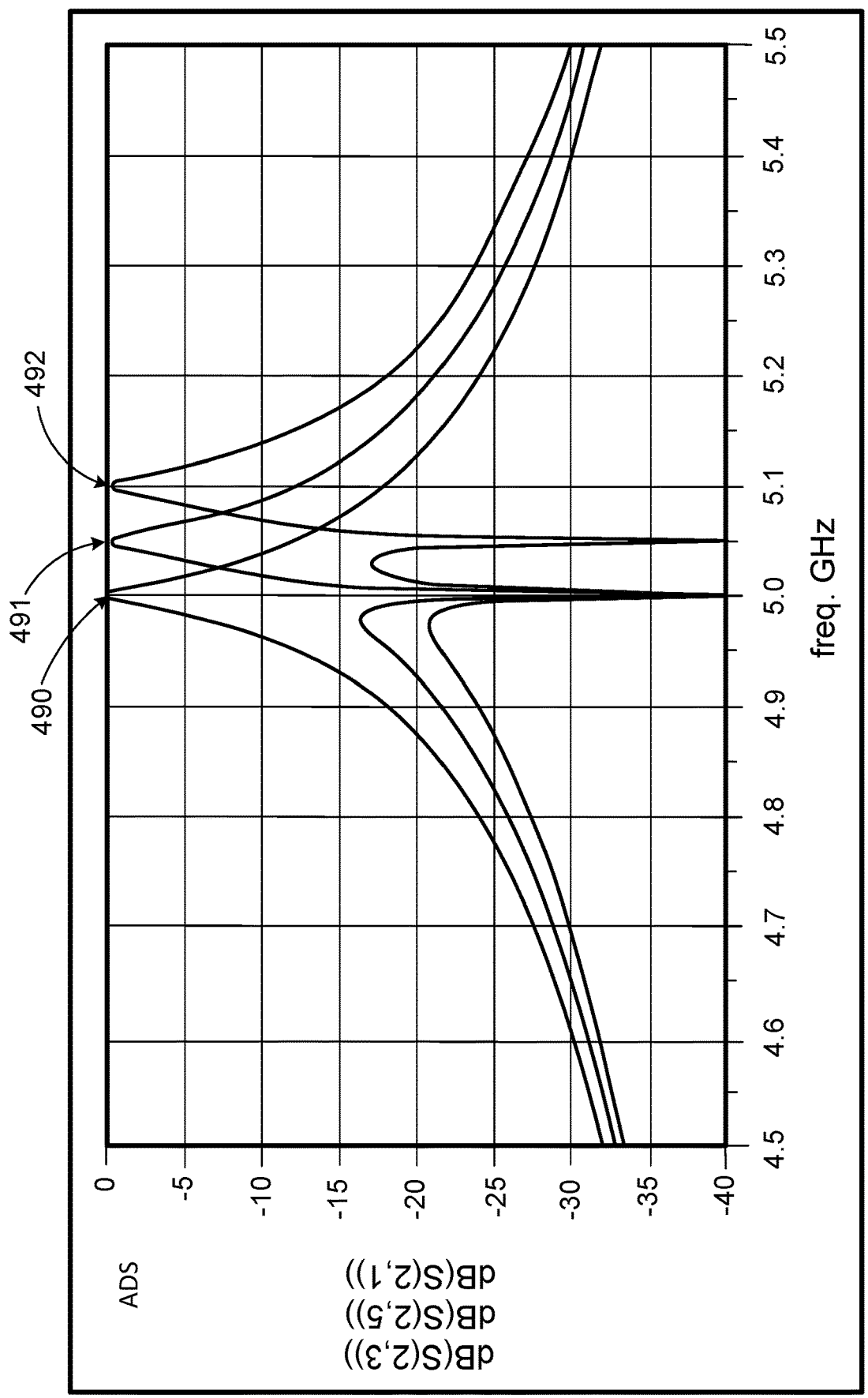

FIG. 4a is a layout drawn as the schematic of the ADS (Advanced Design System) software. Based on the ADS schematic shown in FIG. 4a, a simulation of channelizing of the filter assembly is shown in FIG. 4b.

In the example of FIG. 4a, the first directional multiplexer 430, the second directional multiplexer 431, and the third directional multiplexer 432 are connected in series to the bus transmission line 440. In particular, the third port 430-3, 431-3, 432-3 and the fourth port 430-4, 431-4, 432-4 of the first to third directional multiplexers 430, 431, 432 are connected to the bus transmission line 440. The fourth port 432-4 of the third directional multiplexer 432 is connected to the third port 431-3 of the second directional multiplexer 431. The fourth port 431-4 of the second directional multiplexer 431 is connected to the third port 430-3 of the second directional multiplexer 430. The fourth port 430-4 of the first directional multiplexer 430 is connected to the first amplifier 450. Therefore, the first directional filter 430 is disposed closest to the first amplifier 450 and the third directional filter 450 is disposed farthest from the first amplifier.

The first directional multiplexer 430, the second directional multiplexer 431, and the third directional multiplexer 432 are respectively part of channels 210, 211, 212 which includes respective plurality of qubits 220, 221, 222, as shown in FIG. 2.

The first directional multiplexer 430, the second directional multiplexer 431, and the third directional multiplexer 432 are a single pole directional multiplexer configured as described above in FIG. 3. Each of the first directional multiplexer 430, the second directional multiplexer 431, and the third directional multiplexer 432 is demarcated in FIG. 4a with dotted lines.

Each directional multiplexer includes two directional couplers with a quarter wavelength coupling length, labelled X1 and X2 in the first directional coupler 430, labelled X3 and X4 in the second directional coupler 431, and labelled X5 and X6 in the third directional coupler 432. The two directional couplers are connected with two quarter-wave transmission lines, labelled TL1 and TL2 in the first directional coupler 430, labelled TL3 and TL4 in the second directional coupler 431, and labelled TL5 and TL6 in the third directional coupler 432.

Each directional multiplexer includes four ports, a first port, 430-1, 431-1, 432-1, a second port, 430-2, 431-2, 432-2, a third port, 430-3, 431-3, 432-3, and a fourth port 430-4, 431-4, 432-4. The second port 430-2, 431-2, 432-2 is connected to a termination resistor 436, 437, 438, respectively.

As described in FIG. 2, the first port, 430-1, 431-1, 432-1 of each directional multiplexer 430, 431, 432 is connected to the output of the respective preamplifier 260, 261, 262, 460, 461, 462.

In the ADS schematic shown in FIG. 4a, since only the channelizing aspect of the directional multiplexer assembly is considered in the simulation by measuring the frequency response, the first port, 430-1, 431-1, 432-1 of each directional multiplexer 430, 431, 432 is connected to 50 Ohm resistors for termination. For similar reasons, each end of the bus transmission line 440, including the terminal for the first amplifier 450, is replaced with a 50 Ohm resistor for termination.

Each of the directional multiplexers 430, 431, 432 may have different resonance frequencies or have passbands centered at different frequencies. For example, for the simulation of FIG. 4b, it is assumed that the first directional multiplexer 430 is resonant at 5 GHz, the second directional multiplexer 431 is resonant at 5.05 GHz, and the third directional multiplexer 432 is resonant at 5.1 GHz.

Although in the example of FIG. 4a, the multiplexed qubit readout system 400 includes three directional multiplexers, 430, 431, 432, the number of directional multiplexers 430, 431, 432 is not limited to three. As much as the bandwidth of the first amplifier 450 allows, in view of the bandwidth of each channel attached to the directional multiplexers 430, 431, 432, as explained above, more channels can be added using corresponding number of directional multiplexers 430, 431, 432.

FIG. 4b illustrates a simulation result of the directional band pass filter assembly described in FIG. 4a.

Based on the layout of the multiplexed qubit readout system 400 drawn in the schematic of the ADS (Advanced Design System) software shown in FIG. 4a, a simulation of channelizing of the filter assembly was performed. The result is shown in FIG. 4b.

The first curve 490 shows an S-parameter S21, which represents the frequency response of a linear gain from terminal 1 connected to the output signal of the first preamplifier 450 and the first port 430-1 of the first directional multiplexer 430, to terminal 2 connected to the first amplifier 450 and the fourth port 430-4 via the bus transmission line 440.

The first curve 490 exhibits a single resonance at 5 GHz frequency, where the gain is maximized. Since the first directional multiplexer 430 is disposed closest to the first amplifier 450, the first curve 490 corresponds to the frequency response of the first directional multiplexer 430. This is because, as explained above, the signal entering the first port 430-1 of the first directional multiplexer 430 exits at the fourth port 430-4 of the first directional multiplexer 430 towards the first amplifier 450.

The second curve 491 shows an S-parameter S23, which represents the frequency response of a linear gain from terminal 3 connected to the output signal of the second preamplifier 461 and the first port 431-1 of the second directional multiplexer 431 to terminal 2 connected to the first amplifier 450 and the fourth port 430-4 of the first directional multiplexer 430.

The second curve 491 exhibits a resonance at 5.05 GHz frequency, where the gain is maximized and another resonance at 5 GHz, where a notch rejection or suppression of the gain is exhibited.

The resonance at 5.05 GHz is due to the resonance frequency of the second directional multiplexer 431. Since the first directional multiplexer 430 is disposed between the first amplifier 450 and the second directional multiplexer 431, the signal emanating from the fourth port 431-4 of the second directional multiplexer 431 is received at the third port 430-3 of the first directional multiplexer 430. When this signal is resonant with the first directional multiplexer 430, namely at 5 GHz, the signal is terminated at the second port 430-2 of the first directional multiplexer 430 and prevented from being transmitted towards the first amplifier 450.

The third curve 492 shows an S-parameter S25, which represents the frequency response of a linear gain from terminal 5 connected to the output signal of the third preamplifier 462 and the first port 432-1 of the third directional multiplexer 432 to terminal 2 connected to the first amplifier 450 and the fourth port 430-4 of the first directional multiplexer 430.

The third curve 492 exhibits a resonance at 5.1 GHz frequency, where the gain is maximized and two more resonances at 5 GHz and 5.05 GHz, where a notch rejection or suppression of the gain is exhibited.

The resonance at 5.1 GHz is due to the resonance frequency of the third directional multiplexer 432. Since the first directional multiplexer 430 and the second directional multiplexer 431 are disposed between the first amplifier 450 and the third directional multiplexer 432, the signal emanating from the fourth port 432-4 of the third directional multiplexer 431 is received at the third port 431-3 of the second directional multiplexer 431. If this signal is resonant with the second directional multiplexer 431, namely at 5.05 GHz, the signal is terminated at the second port 431-2 of the second directional multiplexer 431 and prevented from being transmitted towards the first amplifier 450.

The signal which is not resonant with the second directional multiplexer 431 exits from the fourth port 431-4 of the second directional multiplexer 431 and enters the third port 430-3 of the first directional multiplexer 430. If this signal is resonant with the first directional multiplexer 430, namely at 5.0 GHz, the signal is terminated at the second port 430-2 of the first directional multiplexer 430 and prevented from being transmitted towards the first amplifier 450.

Therefore, according to the simulation result shown in FIG. 4b, the directional multiplexer assembly is configured such that the signals resonant with and emanating from respective ones of the directional multiplexers, 430, 431, 432 are transmitted to the first amplifier 450. The frequency multiplexing is achieved because any signal resonant with the directional filter 430, 431, 432 and entering from the third port 430-3, 431-3, 432-3 of the directional multiplexers 430, 431, 432, is rejected by being terminated at the second port 430-2, 431-2, 432-2 and prevented from being transmitted to the first amplifier 450.

Figure 5A:
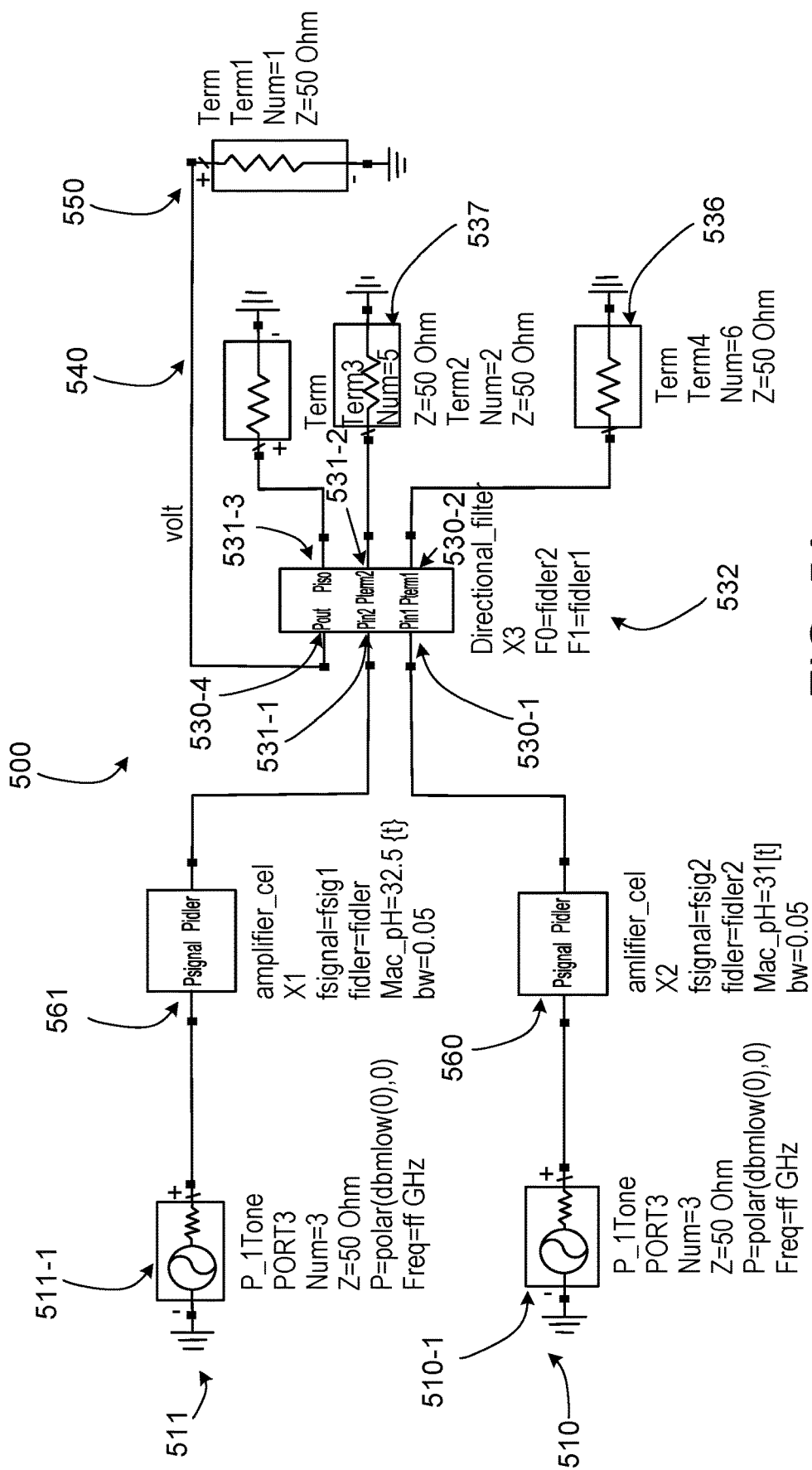
FIG. 5a is a schematic that illustrates an exemplary multiplexed qubit readout system.
Figure 5B:
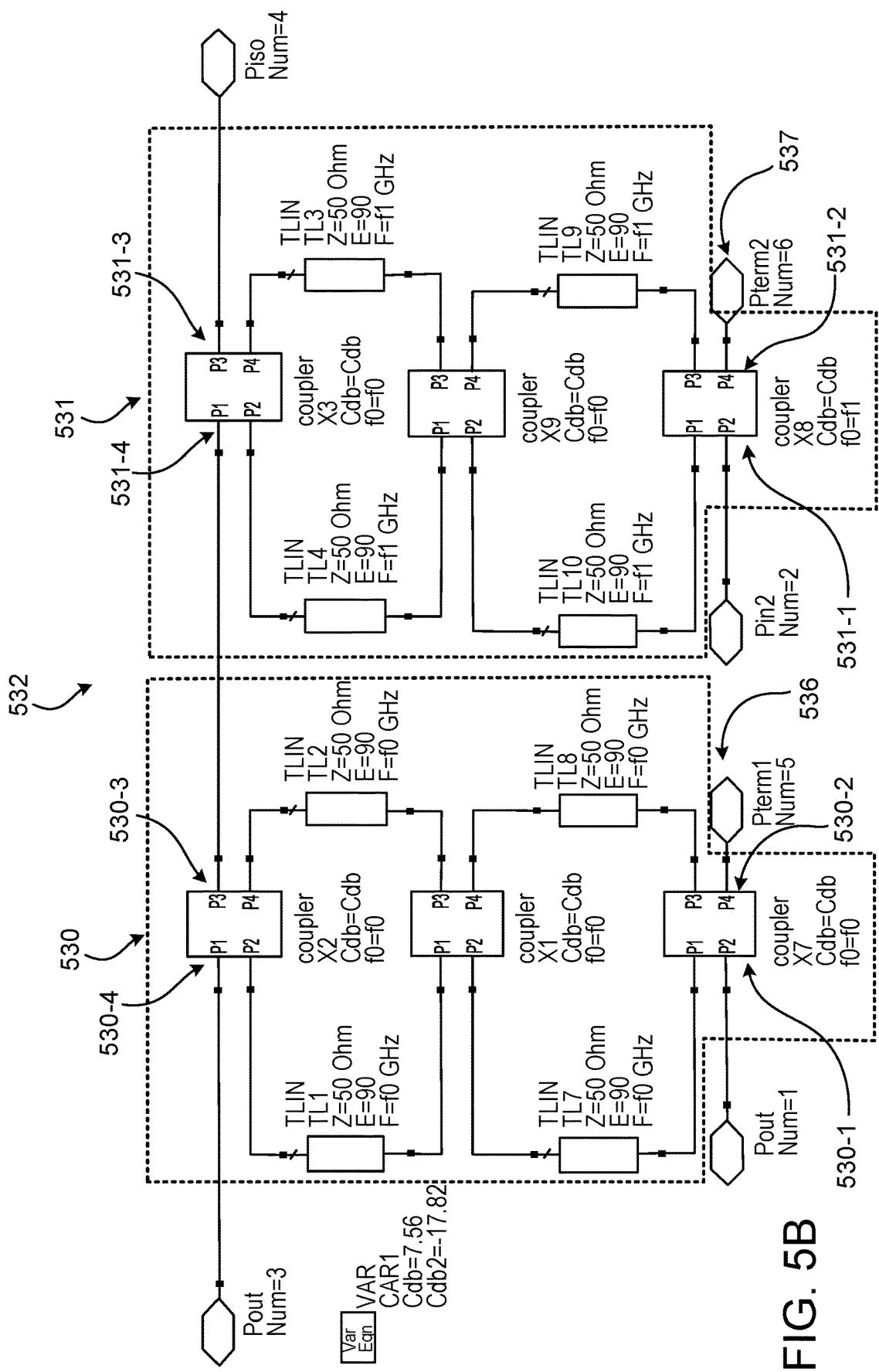

FIG. 5a is a schematic that illustrates an exemplary multiplexed qubit readout system.

In particular, FIG. 5a shows part of the multiplexed qubit readout system 200, 400, 500 including two channels, a first channel 510 and a second channel 511, a directional multiplexer assembly 532, the bus transmission line 540, and the first amplifier 550. Each channel 510 includes a first preamplifier 560 and a second preamplifier 561, which are configured as Josephson parametric amplifiers.

FIG. 5a is a layout drawn as the schematic of the ADS (Advanced Design System) software. Based on the ADS schematic shown in FIG. 5a, a simulation of two readout channels 510, 511 along with the directional multiplexer assembly 532 can be performed using the Harmonic Balance simulator software, as will be shown in FIG. 5c.

Figure 5C:
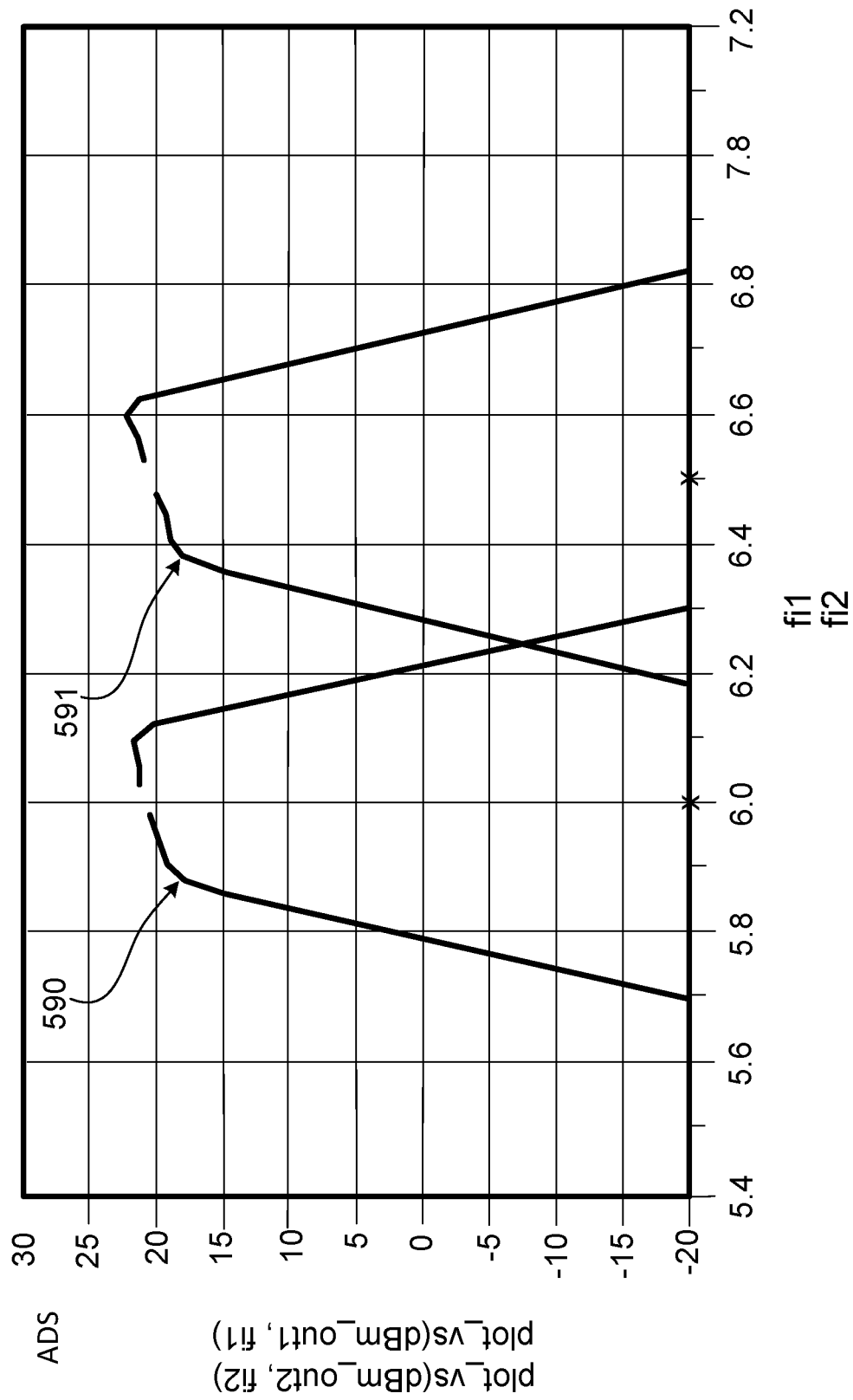
FIG. 5c illustrates a simulation result of the multiplexed qubit readout system including the directional band pass filter assembly described in FIG. 5b.

In order to simulate a probe signal probing the qubits 220, 221, 222 and the respective readout resonators 280, 281, 282, of each channel, 210, 211, 212, 511, 512, a first signal source 510-1 and a second signal source 511-1 are included in the first channel 510 and the second channel 511, respectively. In the example of FIGS. 5a to 5c, both the first signal source 510-1 and the second signal source 511-1 are assumed to generate a first signal and a second signal where the first signal and the second signal are both a single tone which can be swept around 5 GHz. The first signal source 510-1 and the second signal source 511-1 simulate a situation where the resonance frequencies of the readout resonators 280, 281 coupled respectively to the qubits 220, 221 included in the first channel 210, 510 and the second channel 211, 511 are assumed to occupy the same or similar frequency bands and therefore frequency conversion of the signals by the first preamplifier 560 and the second preamplifier 561 is required for frequency multiplexing.

In the examples of FIGS. 5a to 5c, the first preamplifier 560 and the second preamplifier 561 are assumed to be both Josephson junction parametric amplifiers. As discussed above, parametric amplifiers are nonlinear devices in which a reactance in the circuit is modulated by a pump tone of frequency fp to facilitate amplification and frequency conversion from a first band of frequencies Δf centered around f1 to a second band of frequencies Δf centered around f2, such that fp=f1+f2. A pump tone at 11 GHz is provided to the first preamplifier 560 and a pump tone at 11.5 GHz is provided to the second preamplifier 561. When the frequency of the first signal is 5 GHz, the first preamplifier 561 up-converts the frequency of the first signal into 6 GHz. When the frequency of the second signal is 5 GHz, the second preamplifier 562 up-converts the frequency of the second signal at 5 GHz into 6.5 GHz.

The directional multiplexer assembly 532 is configured to combine the signals outputted from the first preamplifier 560 and the second preamplifier 561 into the bus transmission line 540 towards the first amplifier 550. The directional multiplexer assembly 532 includes a first directional multiplexer 530 and a second directional multiplexer 531, each including a first port 530-1, 531-1, a second port 530-2, 531-2, a third port 530-3, 531-3, and a fourth port 530-4, 531-4. As will be shown in FIG. 5b, the four port 531-4 of the second directional multiplexer and the third port 530-3 of the first directional multiplexer are connected to each other internally, although not shown in the schematic shown in FIG. 5a.

The output of the first preamplifier 560 and the second preamplifier 561 are connected to the first port 530-1 of the first directional multiplexer 530 and the first port 531-1 of the second directional multiplexer 531, respectively.

The second ports 530-2, 531-2 of the first directional multiplexer 530 and the second directional multiplexer 531 are connected to termination resistors 536, 537.

In this example, the first directional multiplexer 530 is assumed to be disposed closer to the first amplifier 550. Therefore, the fourth port 530-4 of the first directional multiplexer 530 is connected to the first amplifier 550.

Since only the channelizing aspect of the directional multiplexer assembly 532 is considered by simulating the frequency response, the first amplifier 550 is replaced by a 50 Ohm resistor for termination and an output is monitored at the position of first amplifier 550. In order to terminate the signals reflected from the first amplifier 550, an end of the bus transmission line 540, connected to the third terminal 531-3 of the second directional coupler 531 is connected to a 50 Ohm resistor for termination.

A more detailed structure of the directional multiplexer assembly 532 will be described in FIG. 5b.

FIG. 5b is a schematic that illustrates the directional multiplexer assembly 532 of FIG. 5a. The directional multiplexer assembly 532 includes the first directional multiplexer 530 and the second directional multiplexer 531. The first directional multiplexer 530 and the second directional multiplexer 531 are demarcated with dotted lines.

The first directional multiplexer 530 and the second directional multiplexer 531 are configured as 2-pole resonators, and each comprises three directional couplers with a quarter wavelength coupling length, labelled X2, X1, X7 and X3, X9, X8, respectively, connected with quarter-wave transmission lines labelled TL1, TL2, TL7, TL8 and TL4, TL3, TL9, TL10, respectively.

The first directional multiplexer 530 is configured as follows:

The directional couplers X2 and X1 are connected to each other with the quarter-wave transmission lines TL1 and TL2 in a manner described in FIG. 3. In particular, a first port of the directional coupler X2 is connected to a first port of the directional coupler X1 via a quarter-wave transmission line TL1 and a second port of the directional coupler X2 is connected to a second port of the directional coupler X1 via a quarter-wave transmission line TL2.

The directional couplers X1 and X7 are connected to each other with the quarter-wave transmission lines TL7 and TL8 in a manner described in FIG. 3. In particular, a third port of the directional coupler X1 is connected to a third port of the directional coupler X7 via a quarter-wave transmission line TL7 and a fourth port of the directional coupler X1 is connected to a fourth port of the directional coupler X7 via a quarter-wave transmission line TL8.

The first directional multiplexer 530 includes a first port 530-1, a second port 530-2, a third port 530-3 and a fourth port 530-4.

The first port 530-1 of the first directional multiplexer 530 is of a first port of the directional coupler X7.

The second port 530-2 of the first directional multiplexer 530 is a second port the directional coupler X7.

The third port 530-3 of the first directional multiplexer 530 is a fourth port of the directional coupler X2.

The fourth port 530-4 of the first directional multiplexer 530 is a third port of the directional coupler X2.

The second directional multiplexer 531 is configured as follows: The directional couplers X3 and X9 are connected to each other with the quarter-wave transmission lines TL4 and TL3 in a manner described in FIG. 3. In particular, a first port of the directional coupler X3 is connected to a first port of the directional coupler X9 via a quarter-wave transmission line TL4 and a second port of the directional coupler X3 is connected to a second port of the directional coupler X9 via a quarter-wave transmission line TL3.

The directional couplers X9 and X8 are connected to each other with the quarter-wave transmission lines TL10 and TL9 in a manner described in FIG. 3. In particular, a third port of the directional coupler X9 is connected to a third port of the directional coupler X8 via a quarter-wave transmission line TL10 and a fourth port of the directional coupler X9 is connected to a fourth port of the directional coupler X8 via a quarter-wave transmission line TL9.

The second directional multiplexer 531 includes a first port 531-1, a second port 531-2, a third port 531-3 and a fourth port 531-4.

The first port 531-1 of the second directional multiplexer 531 is of a first port of the directional coupler X8.

The second port 531-2 of the second directional multiplexer 531 is a second port the directional coupler X8.

The third port 531-3 of the second directional multiplexer 531 is a fourth port of the directional coupler X3.

The fourth port 531-4 of the second directional multiplexer 531 is a third port of the directional coupler X3.

As discussed above, the directional multiplexer can be designed to include any number of resonators which are travelling wave loops whose circumference is a multiple of wavelengths at frequency in the middle of the passband or at resonance of the resonators. The first directional multiplexer 530 and the second directional multiplexer 531 include two resonators. For example, in the first directional multiplexer 530, a first resonator is formed by a loop threading the directional couplers X1, X2 and the quarter-wave transmission lines TL1, TL2 and a second resonator is formed by a loop threading the directional couplers X1, X7 and the quarter-wave transmission lines TL7, TL8. The first resonator and the second resonator are coupled by the directional coupler X1. Each loop has a circumference of one wavelength at the frequency in resonance with or in the middle of the passband of the resonator formed by the loop.

The first directional multiplexer 530 and the second directional multiplexer 531 provide a 2-pole response since each includes three directional couplers.

At the second port 530-2 of the first directional multiplexer 530, a termination resistor 536 is connected.

At the second port 531-2 of the second directional multiplexer 531, a termination resistor 537 is connected.

The third port 530-3 of the first directional multiplexer 530 is connected to the fourth port 531-4 of the second directional multiplexer 531. The fourth port 530-4 of the first directional multiplexer 530 is connected to the first amplifier 550, which is replaced with a 50 Ohm resistor for simulation.

The output of the first preamplifier 560 is connected to the first port 530-1 of the second directional multiplexer 530.

The output of the second preamplifier 561 is connected to the first port 531-1 of the second directional multiplexer 531.

FIG. 5c illustrates a simulation result of the multiplexed qubit readout system 500 including the directional band pass filter assembly 530 described in FIG. 5b.

The simulation was performed in the ADS software with Harmonic Balance simulator package.

A first curve 590 represents a power of the first signal from the first signal source 510-1 measured at the termination 550 corresponding to the position of the first amplifier 550 when the frequency of the first signal is swept around 5 GHz and the pump tone into the first preamplifier 560 is fixed at 11 GHz. Since the first preamplifier 560 is configured to convert 5 GHz frequency to 6 GHz, the first curve 590 is centered around 6 GHz. The gain of the first preamplifier 560 is assumed to be 20 dB. The first signal travels through the first directional multiplexer 530 before the first signal reaches the termination 550 for the first amplifier.

The shape of the first curve 590 is given by the response of the first preamplifier 560, in this example a Josephson parametric amplifier. The bandwidth of the first directional multiplexer 530 is set to be wider than the bandwidth of the first preamplifier 560.

A second curve 591 represents a power of the second signal from the second signal source 511-1 measured at the termination 550 corresponding to the position of the first amplifier 550 when the frequency of the second signal is swept around 5 GHz and the pump tone into the second preamplifier 561 is fixed at 11.5 GHz. Since the second preamplifier 561 is configured to convert 5 GHz frequency to 6.5 GHz, the second curve 591 is centered around 6.5 GHz. The gain of the second preamplifier 561 is assumed to be 20 dB. The second signal travels through the second directional multiplexer 531 before the first signal reaches the first directional multiplexer 530 and in turn the termination 550 for the first amplifier.

The shape of the second curve 591 is given by the response of the second preamplifier 561, in this example a Josephson parametric amplifier. The bandwidth of the second directional multiplexer 531 is set to be wider than the bandwidth of the first preamplifier 561. Since the frequency band of the signal outputted from the second directional multiplexer 531 at the four port 531-4 is outside the passband of the first directional multiplexer 530, the second signal is largely unattenuated by the first directional multiplexer 530.

The simulation result shown in FIG. 5c shows that the multiplexed qubit readout system 500 is capable of frequency multiplexing of two channels 510, 511 which contain a plurality of qubits 120, 220 where the resonance frequencies coupled respectively to the qubits occupy the same frequency bands.

Implementations of the quantum subject matter and quantum operations described in this specification can be implemented in suitable quantum circuitry or, more generally, quantum computational systems, also referred to as quantum information processing systems, including the structures disclosed in this specification and their structural equivalents, or in combinations of one or more of them. The terms "quantum computational systems" and "quantum information processing systems" may include, but are not limited to, quantum computers, quantum cryptography systems, topological quantum computers, or quantum simulators.

The terms quantum information and quantum data refer to information or data that is carried by, held or stored in quantum systems, where the smallest non-trivial system is a qubit, e.g., a system that defines the unit of quantum information. It is understood that the term "qubit" encompasses all quantum systems that may be suitably approximated as a two-level system in the corresponding context. Such quantum systems may include multi-level systems, e.g., with two or more levels. By way of example, such systems can include atoms, electrons, photons, ions or superconducting qubits. In some implementations the computational basis states are identified with the ground and first excited states, however it is understood that other setups where the computational states are identified with higher level excited states are possible. It is understood that quantum memories are devices that can store quantum data for a long time with high fidelity and efficiency, e.g., light-matter interfaces where light is used for transmission and matter for storing and preserving the quantum features of quantum data such as superposition or quantum coherence.

Quantum circuit elements (also referred to as quantum computing circuit elements) include circuit elements for performing quantum processing operations. That is, the quantum circuit elements are configured to make use of quantum-mechanical phenomena, such as superposition and entanglement, to perform operations on data in a non-deterministic manner. Certain quantum circuit elements, such as qubits, can be configured to represent and operate on information in more than one state simultaneously. Examples of superconducting quantum circuit elements include circuit elements such as quantum LC oscillators, qubits (e.g., flux qubits, phase qubits, or charge qubits), and superconducting quantum interference devices (SQUIDs) (e.g., RF-SQUID or DC-SQUID), among others.

In contrast, classical circuit elements generally process data in a deterministic manner. Classical circuit elements can be configured to collectively carry out instructions of a computer program by performing basic arithmetical, logical, and/or input/output operations on data, in which the data is represented in analog or digital form. In some implementations, classical circuit elements can be used to transmit data to and/or receive data from the quantum circuit elements through electrical or electromagnetic connections. Examples of classical circuit elements include circuit elements based on CMOS circuitry, rapid single flux quantum (RSFQ) devices, reciprocal quantum logic (RQL) devices and ERSFQ devices, which are an energy-efficient version of RSFQ that does not use bias resistors.

Fabrication of the quantum circuit elements and classical circuit elements described herein can entail the deposition of one or more materials, such as superconductors, dielectrics and/or metals. Depending on the selected material, these materials can be deposited using deposition processes such as chemical vapor deposition, physical vapor deposition (e.g., evaporation or sputtering), or epitaxial techniques, among other deposition processes. Processes for fabricating circuit elements described herein can entail the removal of one or more materials from a device during fabrication. Depending on the material to be removed, the removal process can include, e.g., wet etching techniques, dry etching techniques, or lift-off processes. The materials forming the circuit elements described herein can be patterned using known lithographic techniques (e.g., photolithography or e-beam lithography).

During operation of a quantum computational system that uses superconducting quantum circuit elements and/or superconducting classical circuit elements, such as the circuit elements described herein, the superconducting circuit elements are cooled down within a cryostat to temperatures that allow a superconductor material to exhibit superconducting properties. A superconductor (alternatively superconducting) material can be understood as material that exhibits superconducting properties at or below a superconducting critical temperature. Examples of superconducting material include aluminum (superconductive critical temperature of about 1.2 kelvin), indium (superconducting critical temperature of about 3.4 kelvin), NbTi (superconducting critical temperature of about 10 kelvin) and niobium (superconducting critical temperature of about 9.3 kelvin). Accordingly, superconducting structures, such as superconducting traces and superconducting ground planes, are formed from material that exhibits superconducting properties at or below a superconducting critical temperature.

While this specification contains many specific implementation details, these should not be construed as limitations on the scope of what may be claimed, but rather as descriptions of features that may be specific to particular implementations. Certain features that are described in this specification in the context of separate implementations can also be implemented in combination in a single implementation. Conversely, various features that are described in the context of a single implementation can also be implemented in multiple implementations separately or in any suitable sub-combination. Moreover, although features may be described above as acting in certain combinations and even initially claimed as such, one or more features from a claimed combination can in some cases be excised from the combination, and the claimed combination may be directed to a sub-combination or variation of a sub-combination.

Similarly, while operations are depicted in the drawings in a particular order, this should not be understood as requiring that such operations be performed in the particular order shown or in sequential order, or that all illustrated operations be performed, to achieve desirable results. For example, the actions recited in the claims can be performed in a different order and still achieve desirable results. In certain circumstances, multitasking and parallel processing may be advantageous. Moreover, the separation of various components in the implementations described above should not be understood as requiring such separation in all implementations.

A number of embodiments have been described. Nevertheless, it will be understood that various modifications may be made without departing from the spirit and scope of the invention. Accordingly, other embodiments are within the scope of the following claims.

What is claimed is:

1. A circuit comprising:
a first amplifier having an input;
a transmission line having first and second ends, wherein the first end of the transmission line is coupled to an input of the first amplifier; and
a plurality of channels, each channel comprising:
a plurality of readout resonators arranged to read out a plurality of qubits, respectively; and
a readout line arranged to receive read-out signals from the plurality of resonators,
wherein the readout line of each channel is coupled to the transmission line, and
wherein each channel is configured to output a respective signal in a respective frequency band which is different from frequency bands of other channels in the plurality of channels,
wherein the transmission line is a first transmission line and the readout line comprised by each channel is a second transmission line,
wherein each of the plurality of channels further comprises:
a second amplifier connected to the second transmission line configured to amplify the readout signals from the plurality of readout resonators before the readout signals from the plurality of readout resonators couple to the first transmission line, and
wherein each second amplifier is configured to shift the frequencies of the readout signals to a different corresponding frequency band.

2. The circuit of claim 1,
wherein the second amplifier is a Josephson junction parametric amplifier.

3. The circuit of claim 2, wherein the Josephson junction parametric amplifier is any one of a JPC amplifier, a non-degenerate parametric amplifier, or a travelling wave amplifier.

4. The circuit of claim 2,
wherein each of the plurality of channels further comprises:
a circulator disposed between an output of the second transmission line and the Josephson junction parametric amplifier, arranged to receive and direct the readout signals to the second transmission line towards the plurality of resonators and to direct the readout signals reflected from the plurality of resonators to the Josephson junction parametric amplifier.

5. The circuit of claim 1,
wherein the first amplifier has a first frequency bandwidth and each of the plurality of channels has a different corresponding second frequency bandwidth,
wherein each second frequency bandwidth is smaller than the first frequency bandwidth, does not overlap another second frequency bandwidth, and spans a frequency range within the first frequency bandwidth.

6. The circuit of claim 1,
wherein each of the plurality of channels further comprises:
a directional multiplexer configured to couple the readout signals from the readout line or the second transmission line to the first transmission line towards the first amplifier.

7. The circuit of claim 6,
wherein the directional multiplexer is arranged such that the readout signals travels uni-directionally towards the first amplifier in the first transmission line.

8. The circuit of claim 7,
wherein the directional multiplexer comprises at least one ring resonator, wherein the directional multiplexer further comprises:
a first port arranged to receive the signals from the plurality of readout resonators via the second transmission line;
a second port connected to a termination resistor;
a third port coupled to the first transmission line; and
a fourth port coupled to the first transmission line.

9. The circuit of claim 8,
wherein the directional multiplexer is arranged such that:
in response to the readout signals received at the first port and in resonance with the at least one ring resonator, the readout signals are directed to the fourth port and subsequently into the first transmission towards the first amplifier,
in response to the readout signals received at the first port and out of resonance with the at least one ring resonator, the readout signals are directed to the second port and terminated at the termination resistor,
in response to signals received at the third port from the first transmission line and out of resonance with the at least one ring resonator, the received signals are directed, via the fourth port, into the first transmission line, towards the first amplifier,
in response to signals received at the third port from the first transmission line in resonance with the at least one ring resonator, the received signals are directed to the second port and terminated at the termination resistor.

10. The circuit of claim 8,
wherein the directional multiplexer comprises:
a first directional coupler;
a second directional coupler;
a first quarter wave connector; and
a second quarter wave connector,
wherein the first directional coupler comprises a first port, a second port, a third port and a fourth port,
wherein the second directional coupler comprises a first port, a second port, a third port and a fourth port,
wherein the first port of the directional multiplexer comprises the first port of the second directional coupler, the second port of the directional multiplexer comprises the second port of the second directional coupler, the third port of the directional multiplexer comprises the second port of the first directional coupler and the fourth port of the directional multiplexer comprises the first port of the first directional coupler,
wherein the fourth port of the first directional coupler is connected to the fourth port of the second directional coupler via the first quarter wave connector, and
wherein the third port of the first directional coupler is connected to the third port of the second directional coupler via the second quarter wave connector.

11. The circuit of claim 8,
wherein the directional multiplexer comprises:
a first directional coupler;
a second directional coupler;
a third directional coupler;
a first quarter wave connector;
a second quarter wave connector;
a third quarter wave connector; and
a fourth quarter wave connector,
wherein the first directional coupler comprises a first port, a second port, a third port and a fourth port,
wherein the second directional coupler comprises a first port, a second port, a third port and a fourth port,
wherein the third directional coupler comprises a first port, a second port, a third port and a fourth port,
wherein the first port of the directional multiplexer comprises the first port of the third directional coupler, the second port of the directional multiplexer comprises the second port of the third directional coupler, the third port of the directional multiplexer comprises the fourth port of the first directional coupler and the fourth port of the directional multiplexer comprises the third port of the first directional coupler,
wherein the first port of the first directional coupler is connected to the first port of the second directional coupler via the first quarter wave connector,
wherein the second port of the first directional coupler is connected to the second port of the second directional coupler via the second quarter wave connector,
wherein the third port of the second directional coupler is connected to the third port of the third directional coupler via the third quarter wave connector, and
wherein the fourth port of the second directional coupler is connected to the fourth port of the third directional coupler via the fourth quarter wave connector.

12. The circuit of claim 1,
wherein the first amplifier is a HEMT (High Electron Mobility Transistor) amplifier or a silicon germanium amplifier.

13. The circuit of claim 8,
wherein the first transmission line is impedance-matched at 50 Ohm.

* * * * *